US007109714B2

(12) United States Patent
Rudakov et al.

(10) Patent No.: US 7,109,714 B2
(45) Date of Patent: Sep. 19, 2006

(54) Q-FACTOR SWITCHING METHOD AND APPARATUS FOR DETECTING NUCLEAR QUADRUPOLE AND NUCLEAR MAGNETIC RESONANCE SIGNALS

(75) Inventors: Taras Nikolaevitch Rudakov, Western Australia (AU); Vassili Timofeevitch Mikhaltsevitch, Western Australia (AU); Warrick Paul Chisholm, Western Australia (AU); John Harold Flexman, Western Australia (AU); Peter Alaric Hayes, Western Australia (AU)

(73) Assignee: Qrsciences Pty. Ltd., (AU)

( * ) Notice: Subject to any disclaimer, the term of this patent is extended or adjusted under 35 U.S.C. 154(b) by 0 days.

(21) Appl. No.: 10/838,256

(22) Filed: May 5, 2004

(65) Prior Publication Data

US 2005/0116714 A1 Jun. 2, 2005

Related U.S. Application Data

(63) Continuation-in-part of application No. PCT/AU02/01513, filed on Nov. 5, 2002.

(30) Foreign Application Priority Data

Nov. 5, 2001 (AU) ................................ PR 8682

(51) Int. Cl.
*G01V 3/00* (2006.01)

(52) U.S. Cl. ........................................ 324/322; 324/318

(58) Field of Classification Search ................ 324/318, 324/322, 319, 314, 300, 309, 307
See application file for complete search history.

(56) References Cited

U.S. PATENT DOCUMENTS 5,051,700 A * 9/1991 Fox .............................. 324/322

(Continued)

FOREIGN PATENT DOCUMENTS

GB  2 298 283  8/1996

(Continued)

OTHER PUBLICATIONS

Conradi, "FET Q Switch for Pulsed NMR", The Review of Scientific Instruments, vol. 48, No. 3, Mar. 1977, pp. 359-361.

(Continued)

*Primary Examiner*—Brij B. Shrivastav
(74) *Attorney, Agent, or Firm*—Michael Bednarek; Pillsbury Winthrop Shaw Pittman LLP

(57) ABSTRACT

A probe (80) for irradiating a sample with RF energy during transmitting periods and detecting an NQR or NMR signal from a substance contained within the sample during receiving periods. The probe (80) comprises a variable impedance unit (20) for changing the Q-factor of the probe and a probe coil. The probe (80) is responsive to powerful RF pulses applied thereto to excite an RF magnetic field in the probe coil during the transmitting periods. The variable impedance unit (20) is controllable to provide a Q-factor for the probe (80) at:

(i) an optimal level during a prescribed transmitting period of an RF pulse for irradiating the sample with said RF energy;
(ii) a minimal level during a prescribed recovery period immediately following said transmitting period to rapidly dampen transient signals from the probe; and
(iii) a maximal level during a prescribed receiving period for detecting an NQR or NMR signal from the target substance if present, immediately following the recovery period.

A method for detecting an NQR or NMR signal within a sample using the probe (80) is also described.

28 Claims, 16 Drawing Sheets

U.S. PATENT DOCUMENTS

| | | | |
|---|---|---|---|
| 5,172,061 A * | 12/1992 | Crooks et al. | 324/322 |
| 5,546,000 A * | 8/1996 | Maas et al. | 324/322 |
| 5,592,083 A * | 1/1997 | Magnuson et al. | 324/300 |
| 5,594,338 A * | 1/1997 | Magnuson | 324/318 |
| 5,804,967 A * | 9/1998 | Miller et al. | 324/314 |
| 5,986,455 A * | 11/1999 | Magnuson | 324/318 |
| 6,194,898 B1 * | 2/2001 | Magnuson et al. | 324/300 |
| 6,242,918 B1 | 6/2001 | Miller et al. | 324/322 |
| 6,291,994 B1 * | 9/2001 | Kim et al. | 324/300 |

FOREIGN PATENT DOCUMENTS

| | | |
|---|---|---|
| GB | 2298283 | 8/1996 |
| GB | 2 319 086 | 5/1998 |
| GB | 2319086 | 5/1998 |
| GB | 2 319 852 | 6/1998 |
| GB | 2319852 | 6/1998 |
| RU | 2087920 | 8/1997 |
| WO | WO 96/26453 | 8/1996 |
| WO | WO 9626453 | 8/1996 |
| WO | WO 99/14615 | 3/1999 |
| WO | WO 9914615 | 3/1999 |

OTHER PUBLICATIONS

Kisman et al., Coupling Scheme and Probe Damper for Pulsed Nuclear Magnetic Resonance Single Coil Probe, The Review of Scientific Instruments, vol. 45, No. 9, Sep. 1974, pp. 1159-1163.

Hoult, Fast Recovery, High Sensitivity NMR Probe and Preamplifier for Low Frequencies, The Review of Scientific Instruments, vol. 50, No. (2), Feb. 1979, pp. 193-200.

Rudakov et al., "Damping of Transients in an Excited Circuit of an NQR Spectrometer", Instruments and Experimental Techniques, vol. 38, No. 6, Part 1, 1995, pp. 744-745.

Suits et al., "Super-Q Detection of Transient Magnetic Resonance Signal", Journal of Magnetic Resonance, vol. 132, 1998, pp. 54-64.

Samuelson et al., Self-Switching Damping Circuit for Reducing Transmitter Ringdown Time in High Power Pulse NMR', The Review of Scientific Instruments, vol. 41, No. 11, Nov. 1970, pp. 1601-1603.

Decorps et al., "An Inductively Coupled, Series-Tuned NMR Probe", Journal of Magnetic Resonance, vol. 65, 1985, pp. 100-109.

Roeder et al., "A Single-Coil Probe Damper for Pulsed Nuclear Magnetic Resonance", The Review of Scientific Instruments, vol. 42, No. 11, Nov. 1971, pp. 1692-1693.

Floridi et al., "Fast-Recovery Crossed-Coil Probe for Low Frequency Solid-State NMR", Measurement Science and Technology, vol. 2, 1991, pp. 934-937.

Stokes, "Tuned Limiter for Receiver Amplifier in a Fast-Recovery Pulsed NMR Spectrometer", The Review of Scientific Instruments, vol. 49, No. 7, 1978, pp. 1011-1012.

Hirschfeld, "Short Range Remote NQR Measurements", Journal of Molecular Structure, vol. 58, 1980, pp. 63-77.

Hoult, "Fast Recovery With a Conventional Probe", Journal of Magnetic Resonance, vol. 57, 1984, pp. 394-403.

Andrew et al., "NMR Probe With Short Recovery Time", Journal of Magnetic Resonance, vol. 73, 1987, pp. 268-276.

Patent Abstracts of RU 2087920 published on Aug. 20, 1997.

Conradi, "FET Q Switch for Pulsed NMR", The Review of Scientific Instruments, vol. 48, No. 3, Mar. 1977, pp. 359-361.

Kisman et al., "Coupling Scheme and Probe Damper for Pulsed Nuclear Magnetic Resonance Single Coil Probe", The Review of Scientific Instruments, vol. 45, No. 9, Sep. 1974, pp. 1159-1163.

Hoult, "Fast Recovery, High Sensitivity NMR Probe and Preamplifier for Low Frequencies", The Review of Scientific Instruments, vol. 50, No. (2), Feb. 1979, pp. 193-200.

Rudakov et al., "Damping of Transients in an Excited Circuit of an NQR Spectrometer", Instruments and Experimental Techniques, vol. 38, No. 6, Part 1, 1995, pp. 744-745.

Suits et al., "Super-Q Detection of Transient Magnetic Resonance Signals", Journal of Magnetic Resonance, vol. 132, 1998, pp. 54-64.

Samuelson et al., "Self-Switching Damping Circuit for Reducing Transmitter Ringdowm Time in High Power Pulse NMR", The Review of Scientific Instruments, vol. 41, No. 11, Nov. 1970, pp. 1601-1603.

Decorps et al., "An Inductively Coupled, Series-Tuned NMR Probe", Journal of Magnetic Resonance, vol. 65, 1985, pp. 100-109.

Roeder et al., "A Single-Coil Probe Damper for Pulsed Nuclear Magnetic Resonance", The Review of Scientific Instruments, vol. 42, No. 11, Nov. 1971, pp. 1692-1693.

Floridi et al., "Fast-Recovery Crossed-Coil Probe for Low Frequency Solid-State NMR", Measurement Science and Technology, vol. 2, 1991, pp. 934-937.

Stokes, "Tuned Limiter for Receiver Amplifier in a Fast-Recovery Pulsed NMR Spectrometer", The Review of Scientific Instruments, vol. 49, No. 7, 1978, pp. 1011-1012.

Hirschfeld, "Short Range Remote NQR Measurements", Journal of Molecular Structure, vol. 58, 1980, pp. 63-77.

Hoult, "Fast Recovery With a Convential Probe", Journal of Magnetic Resonance, vol. 57, 1984, pp. 394-403.

Andrew et al., "NMR Probe with Short Recovery Time", Journal of Magnetic Resonance, vol. 73, 1987, pp. 268-276.

* cited by examiner

Q-FACTOR SWITCHING METHOD AND APPARATUS FOR DETECTING NUCLEAR QUADRUPOLE AND NUCLEAR MAGNETIC RESONANCE SIGNALS

This appln. is a Continuation-in-part of PCT/AU02/01513 filed Nov. 5, 2002.

FIELD OF THE INVENTION

This invention relates to nuclear quadrupole resonance (NQR) and nuclear magnetic resonance (NMR) detection equipment, and more particularly to an apparatus and method for changing the Q-factor (quality factor) of a probe used in NQR and NMR detection equipment.

Within this specification the term "substance" is taken to mean those materials which respond to the NQR and NMR phenomenon. For a discussion of the NQR phenomenon, regard should be made to our co-pending International Patent Application PCT/AU00/01214, which is incorporated herein by reference.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The following discussion of the background art is intended to facilitate an understanding of the present invention only. It should be appreciated that the discussion is not an acknowledgement or admission that any of the material referred to was part of the common general knowledge as at the priority date of the application.

Nuclear quadrupole resonance (NQR) and nuclear magnetic resonance (NMR) are methods widely used for the detection and investigation of various chemical compounds. These methods are also successfully used for detecting the presence of specific substances, such as explosives and narcotics.

The probe of a pulsed NQR (or NMR) detection system is a device providing interaction between the radio frequency (RF) field of a resonant RF transmitter and a particular substance that is targeted within a sample for detection of NQR (or NMR) signals generated as a result of the NQR (or NMR) phenomena, as well as interaction between the RF field response from the target substance and the receiving part of the NQR (or NMR) detector. Strong RF pulses, typically with hundreds of watts of power are used. In practical NQR devices, when detecting specific substances (for example explosives and narcotics), the power of RF pulses can reach several kW.

FIG. 1 illustrates a conventional system for detecting NQR (or NMR) signals from a target substance. For NMR a magnet is required but this is not shown in FIG. 1. A transmitter unit 60' and a receiver unit 50' are connected to a probe 80' through a duplexer and matching circuit 40' which switches the probe 80' between a transmit mode and a receive mode. The transmitter unit 60' generates RF pulses and applies the pulses to the probe 80' during a transmitting period when in the transmit mode to irradiate a sample with RF energy and excite nuclei of any target substance contained within the sample. The pulses have a frequency corresponding to the resonant frequency of the nuclei of the substance to be detected and the probe 80' is tuned to this resonant frequency typically by a tank circuit to optimise the Q-factor of the probe for optimal detection. After the RF pulse is applied, the probe 80' can detect the NQR (or NMR) signal. This signal is received by the receiver unit 50' during a receiving period when in the receive mode and is processed by a control and signal-processing unit 70', which also generates all control and RF signals.

Strong radio frequency (RF) pulses applied to the probe produce transient signals ("ringing"). This results from the accumulation of energy in the circuit of a probe after the impact of RF pulses. This remaining RF energy must be dissipated before a probe can be effectively used to receive the NQR (or NMR) signal. After the probe has rung down, the NQR (or NMR) signal from the sample can be detected.

The duration of these transient signals, which determines the length of the recovery period of a probe, can be quite considerable—from several hundred microseconds to several milliseconds. This is particularly apparent when detecting low frequency NQR samples within a high Q-factor probe coil.

NQR frequencies of many significant explosive and narcotic substances are found in the low frequency range (0.1–6 MHz) and need to be detected within timeframes of 300 μs to 1.2 ms after irradiation of a sample containing same with RF energy for determining their existence. Hence ringing can present a major problem for detecting NQR signals lying in this low frequency range. Low frequency NMR and Magnetic Resonance Imaging (MRI) are also important for biological and medical research, as well as for some other purposes, and thus ringing also presents a problem with the detection of low frequency signals in these technologies as well.

In order to overcome this problem the signal-to-noise (SNR) ratio in the probe needs to be increased. This can be achieved by using high quality probe coils having a Q-factor ranging from between several hundred to several thousand.

The time constant of a tank circuit for a probe is generally expressed by:

$$\tau = \frac{Q}{\pi f},$$

where Q is the quality factor and f is the resonant frequency. Thus in the case of high Q (for example around 1000) of the tank circuit, the recovery period of the probe after the irradiation of the sample with the powerful RF pulse is very long.

In the art, the requirement for a long recovery period of the probe for dissipating the transient signals prior to being able to detect NQR (or NMR) signals during the receiving period results in causing a considerable decrease in the detection sensitivity. Firstly, the induced delay in switching-on the receiver system to provide for the recovery period of the probe results in a part of the useful signal energy in any responsive NQR (or NMR) signal being lost. Secondly, this delay imposes serious time limitations when using multi-pulse sequences. For example, when using the steady-state free-precession (SSFP) or spin-locking spin-echo (SLSE) type sequences, the best detection sensitivity is achieved when the pulse spacing is optimised, which is determined by the relaxation parameters for each substance. When the recovery period of the probe is long, the optimum pulse spacing cannot be achieved in most instances, and this leads to subsequent losses in the detection sensitivity. Consequently it is desirable to get the resonant probe to ring-down as soon as possible during the recovery period.

A very high Q for a tank circuit is also undesirable during the transmitting period. With a high Q, the time constant of the tank circuit can be too long and the leading edge of the pulse envelope does not have time to develop. This results in the amplitude of the RF pulse not necessarily being able to reach its maximum value in the required time. The shape of the pulse then gets distorted and becomes "triangular" which is not always desirable.

The increase in the pulse duration leads to a reduction in its spread in the frequency domain, and consequently the RF pulse bandwidth can then become narrower than the NQR (or NMR) resonance line. In this case the resonance line will not be fully excited, which will make the SNR lower.

Too higher Q also limits the effectiveness of amplitude, frequency or phase modulating the pulse. Therefore, for the efficient NQR (or NMR) signal detection in many practical applications, such as detecting the presence of specific substances, the value of the Q-factor during the transmitting period must be lower than during the receiving period.

Various techniques have been used to reduce the ring-down time of the probe and hence the recovery period. One of the more widely used is the resistive damping technique based on the use of a resistive damping element, which is electrically coupled to the probe with diodes. In the transmit mode this resistive element damps a probe during the transmitting of the RF pulse and for some time after it, keeping a low Q-factor. When the amplitude of the transient signals reaches the lower threshold voltage, a high maximum Q-factor is then provided. A disadvantage of this method is the necessity to use a very low Q-factor to achieve a rapid diminution of the transient signals. Due to losses caused by this element, additional increased pulse power is needed. In addition, due to Johnson noise, the resistive damping element in the probe can reduce the SNR.

Techniques based on Q-switched damping are also known. This method involves active damping by switching the total Q-factor from a high maximum Q-factor during the transmit mode to a low Q-factor during the ring-down period, and back to a high maximum Q-factor during the receive mode. Q-switched damping uses actively switched elements (such as transistors, actively switched diodes, triacs or thyristors). When the transistors or diodes are used, a parasitic charge may be injected into the probe via the parasitic capacitance of these elements and so cause the probe to ring anew unless appropriate precautions are taken. Other switching elements (such as a triac or thyristor) switch themselves off after a certain recovery time. They do not require a switch off control signal. Therefore no charge is injected and no new ringing appears when the damping is removed. However, these devices offer less control.

A similar effect can be achieved when using the so-called "slow" transistor. This "slow" transistor exhibits a response time between receiving a switch-off signal and actually switching off. This response time is of the order of the damped ring-down time or recovery period of the probe. However the use of such a transistor requires cascade connection of other elements, such as resistors or/and diodes, which diminish the efficiency of damping and are a source of additional noise.

Unfortunately, the use of actively switched elements for Q-switched damping of the resonance circuit is limited by the maximum voltage capacity of these elements. In practice it is very difficult to find a suitable device capable of switching more than 1000V. For many practical purposes RF voltage can exceed this value considerably, which inevitably leads to the breakdown of the actively switched element. It is possible to find some kinds of actively switched elements, which have a maximum voltage capacity higher than 1000V, however usually this voltage still is not sufficient for practical use. There are also other reasons as to why these elements do not provide fast and efficient damping of the probe, making them unsuitable for use in NQR and NMR applications.

DISCLOSURE OF THE INVENTION

It is an object of this invention to provide for changing the Q-factor of a probe in nuclear quadrupole resonance (NQR) or nuclear magnetic resonance (NMR) detection for the purpose of optimally sensing NQR or NMR signals from a target substance irradiated with RF energy, without some or all of the disadvantages associated with previous detection methods and systems.

It is a preferred object of the invention to accomplish the detection of NQR or NMR signals from the target substance whilst using a high Q coil in the probe and a high RF voltage during the time that high power. RF pulses are applied to the target substance.

It is a further preferred object of this invention to provide optimal parameters for transmitting the RF pulses during the transmit mode and high sensitivity of the system during the receive mode.

In the present invention, these objects are achieved by changing the Q-factor of the probe to different Q-factors during: (1) the transmitting period of the pulse, (2) the recovery period immediately after the transmitting period and (3) the receiving period immediately after the recovery period in methods or apparatuses for NQR or NMR detection.

Thus, in accordance with one aspect of the present invention, there is provided an apparatus for changing the Q-factor of a probe for an NQR or NMR apparatus including Q-factor setting means for setting the Q-factor of the probe and Q-factor changing means for changing the Q-factor of the probe for detecting an NQR or NMR signal from a target substance within a sample irradiated with RF energy wherein the Q-factor changing means is controllable to change the Q-factor of the probe to:

(i) an optimal level during a prescribed transmitting period of an RF pulse for irradiating the sample with said RF energy;

(ii) a minimal level during a prescribed recovery period immediately following said transmitting period to rapidly dampen transient signals from the probe; and a maximal level during a prescribed receiving period for detecting an NQR or NMR signal from the target substance if present, immediately following the recovery period.

Preferably, the probe has an impedance that can be varied to achieve a Q-factor of minimal orders of magnitude during the recovery period and a Q-factor of high orders of magnitude during the receiving period.

Preferably, the Q-factor changing means has low reactance for actively changing the Q-factor of the probe without injecting a parasitic charge thereon.

Preferably, the optimal level is sufficiently low to reduce the prescribed recovery period to a period in which the transient signals may be dampened and to develop the leading edge of the pulse envelope of said RF pulse during said transmitting period; the optimal level is also sufficiently high to reduce the bandwidth of said RF pulse during said transmitting period and so mitigate the power expended in amplifying the pulse envelope over the bandwidth; and the maximal level is sufficiently high for the probe to receive a signal during the receiving period, after the recovery period, to enable an NQR or NMR signal emitted from a substance within the sample to be detected.

Preferably, the reactance of the Q-factor changing means that is low is the capacitive reactance thereof.

Preferably, the Q-factor changing means comprises a variable impedance unit which combines with the probe coil to form a tank resonant circuit that is capable of receiving powerful RF pulses applied to the probe from the output of a transmitter, and permitting an RF magnetic field to be excited in the probe coil during transmitting periods.

In this manner, the magnetic field may act on the sample and lead to the excitation of a resonance signal in it from any traces of the target substance in the sample. After the RF pulse stops, any such resonance signal should appear in the probe and exist there together with any transient signals ("ringing") in the probe.

To ensure the optimum shape and duration of the powerful RF pulses, the specific total Q-factor in the probe is preferably set by Q-factor setting means during the transmitting period to the optimal level in orders of hundreds. For a rapid ring-down in the probe, the Q-factor during the recovery period required for a complete damping of the transient signals is preferably made by the Q-factor setting means to be in orders of magnitude of ones or tenths. The maximum value of the total Q-factor that permits detection of an NQR or NMR signal is set by the Q-factor setting means during the receiving period (after the recovery period) t orders of hundreds or thousand. The value of the total Q-factor of the probe is changed by varying the impedance of the tank resonant circuit incorporating the probe coil using the variable impedance unit.

Preferably, the Q-factor changing means is controllable to change the Q-factor of the probe in accordance with said Q-factor setting means further to actively step the impedance of the probe down after said transmitting period to provide the requisite minimal level of the Q-factor for the probe for some period of time during the recovery period.

Preferably, the impedance of the probe is stepped down to a first minimal level of magnitude during a first period of the recovery period immediately following said transmitting period and then to a second minimal level of magnitude lower than said first minimal level during a subsequent period of the recovery period, prior to said receiving period.

Preferably, the variable impedance unit comprises a variable step impedance element and switching control elements that may be actively switched to step the impedance elements to provide the requisite Q-factor for the probe.

Preferably, the switching control elements are included only in the control circuits of the variable step impedance element.

This permits the use of a high RF voltage in the probe that considerably exceeds the normally permissible voltage for actively switching the switching elements.

Alternatively, the switching elements may be placed in electrical series with one another and in parallel with resistive elements to enable higher permissible voltages on the tank circuit and to achieve a plurality of possible Q-factor values during the transmitting, recovery and receiving periods. Other elements such as a capacitor network or zener diodes may be included improving the voltage sharing during switching. Here, the low level drive signals need to be electrically isolated. This may be achieved by a number of means including optical isolation and pulse transformers.

Preferably, a balanced coil together with Q-switching elements are provided in the probe.

Preferably, the switching control elements have a low capacitive reactance.

Preferably, a said switching control element comprises a triac or thyristor.

Preferably, the switching control elements are coupled with an inductive element during the period that the impedance of the probe is stepped down to said first minimal level to protect said switching control elements from voltage applied thereto pursuant to the resultant change in impedance, and are decoupled from said inductive element during the period that the impedance of the probe is stepped down to said second minimal level to minimise the inductance of said switching control elements and thus the reactance of the variable impedance to minimise the impedance of the probe to change the Q-factor to said minimal level during the recovery period.

Preferably, the first minimal level of the Q-factor is in orders of magnitude of ones, and said second minimal level of the Q-factor is in orders of magnitude of tenths.

In accordance with another aspect of the present invention, there is provided a method for detecting an NQR or NMR signal within a sample comprising:

setting the Q-factor of a probe for irradiating the sample with an RF magnetic field pulse to an optimal level to achieve an optimum shape and duration of the RF pulse for subsequent detection of NQR or NMR signals from the sample;

transmitting the RF magnetic field pulse with the probe set at said optimal level during the prescribed transmitting period to irradiate the sample and excite an NQR or NMR signal in the sample if a substance providing for NQR or NMR is present;

actively changing the Q-factor of the probe to a minimal level during a prescribed recovery period immediately following the prescribed transmitting period; and actively changing the Q-factor of the probe to a maximal level having high orders of magnitude during the prescribed receiving period immediately following the prescribed recovery period, the maximal level being sufficiently high for detecting the presence of any NQR or NMR signals in a signal received from the substance during the receiving period;

wherein the optimal level at which the Q-factor for the probe is set during the prescribed transmitting period is:
  (i) sufficiently low to reduce said prescribed recovery period to a period in which said transient signals may be dampened and to develop the leading edge of the pulse envelope of said RF pulse during said transmitting period; and
  (ii) is also sufficiently high to reduce the bandwidth of said RF pulse during said transmitting period and so mitigate the power expended in amplifying the pulse envelope over the bandwidth;

and wherein said setting and changing of the Q-factor of the probe is performed without injecting a parasitic charge into the probe. Preferably, the method includes setting or changing the minimal level of the Q-factor of the probe during the recovery period to orders of magnitude of ones or tenths so as to be considerably lower than the Q-factor of the probe before and after the recovery period so as to completely dampen the transient signals and provide for a rapid ring-down in the probe.

Preferably, the method includes setting or changing the maximal level of the Q-factor of the probe during the receiving period to orders of magnitude of hundreds or thousand to be considerably higher than the optimal level of the Q-factor of the probe during the transmitting period and the minimal level of the Q-factor of the probe during the recovery period.

Preferably, the method includes actively stepping the impedance of the probe down after said transmitting period to provide the requisite minimal level of the Q-factor for the probe for some period of time during the recovery period.

Preferably, the method includes stepping down the impedance of the probe to a first minimal level of magnitude during a first period of the recovery period immediately following said transmitting period and then to a second minimal level of magnitude lower than said first minimal level during a subsequent period of the recovery period, prior to said receiving period.

BRIEF DESCRIPTION OF THE DRAWINGS

FIG. 3 illustrates graphs of waveforms seen at different positions of the apparatus illustrated in FIG. 2 plotted with respect to time using a three-level Q-switching arrangement, wherein:

FIG. 3a shows a pulse produced by a transmitter unit,
FIG. 3b shows a first control pulse produced by a control and signal processing unit,
FIG. 3c shows a second control pulse produced by the control and signal processing unit, and
FIG. 3d shows the Q-factor for the coil of the apparatus.

FIG. 8 illustrates graphs of waveforms seen at different positions of the apparatus illustrated in FIG. 2 plotted with respect to time using a four-level Q-switching arrangement, wherein:

FIG. 8a shows a pulse produced by a transmitter unit,
FIG. 8b shows a first control pulse produced by a control and signal processing unit,
FIG. 8c shows a second control pulse produced by the control and signal processing unit,
FIG. 8d shows a third control pulse produced by the control and signal processing unit, and
FIG. 8e shows the Q-factor for the coil of the apparatus.

BEST MODE(S) FOR CARRYING OUT THE INVENTION

The best mode of the present invention is directed towards an apparatus and method that causes the changing of the Q-factor of the probe to different Q-factors during: (i) a prescribed transmitting period when the apparatus is in the transmit mode, (ii) a prescribed recovery period immediately following the transmitting period, and (iii) a receiving period when the apparatus is in the receive mode immediately after the recovery period; in discrete steps.

This mode has advantages over conventional designs that are pointed out within the description hereinafter.

Figure 1:
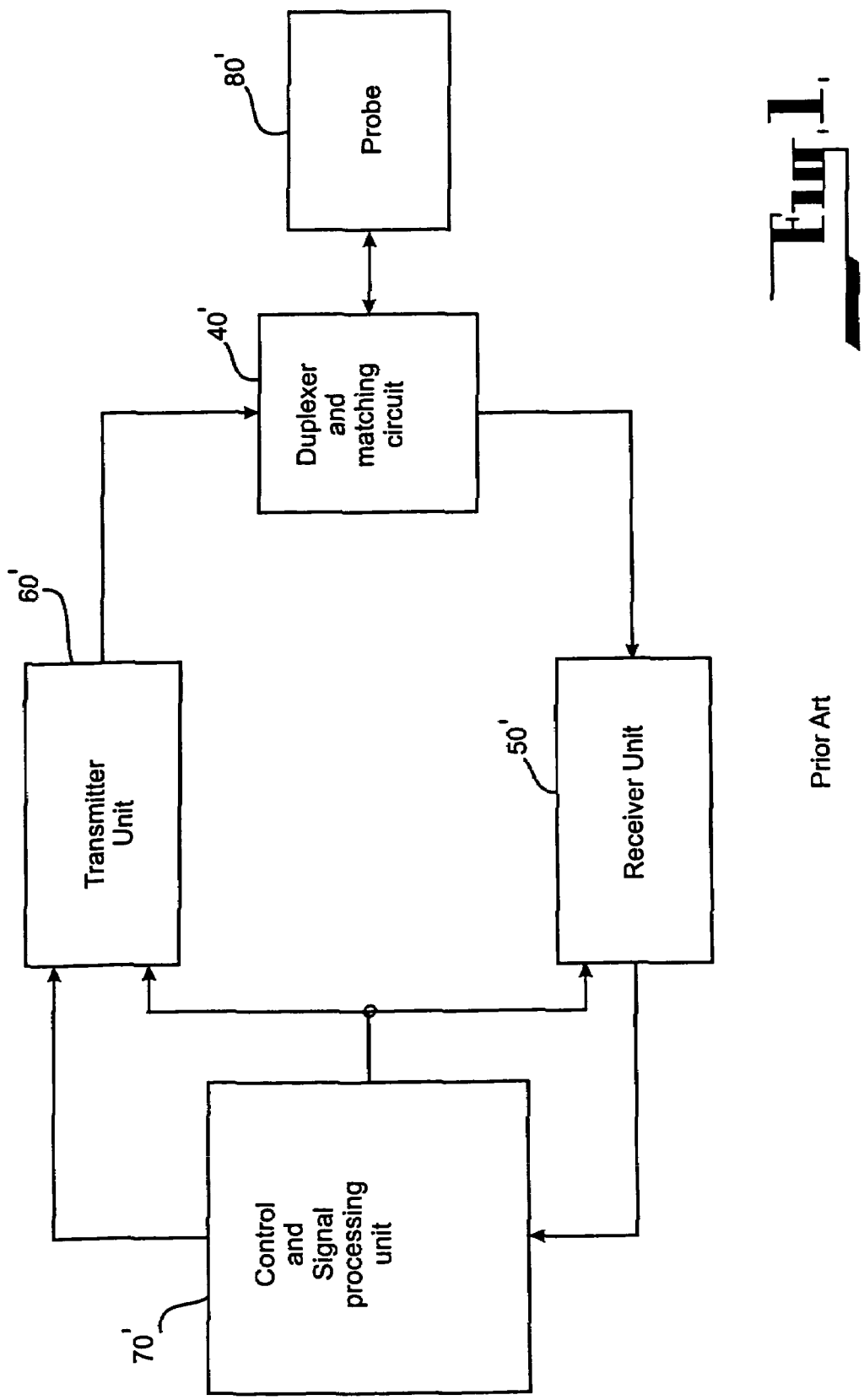
FIG. 1 (prior art) is a block diagram of a conventional NQR or NMR (magnet is not shown) apparatus for detecting a resonance signal in the specimen.
Figure 2:
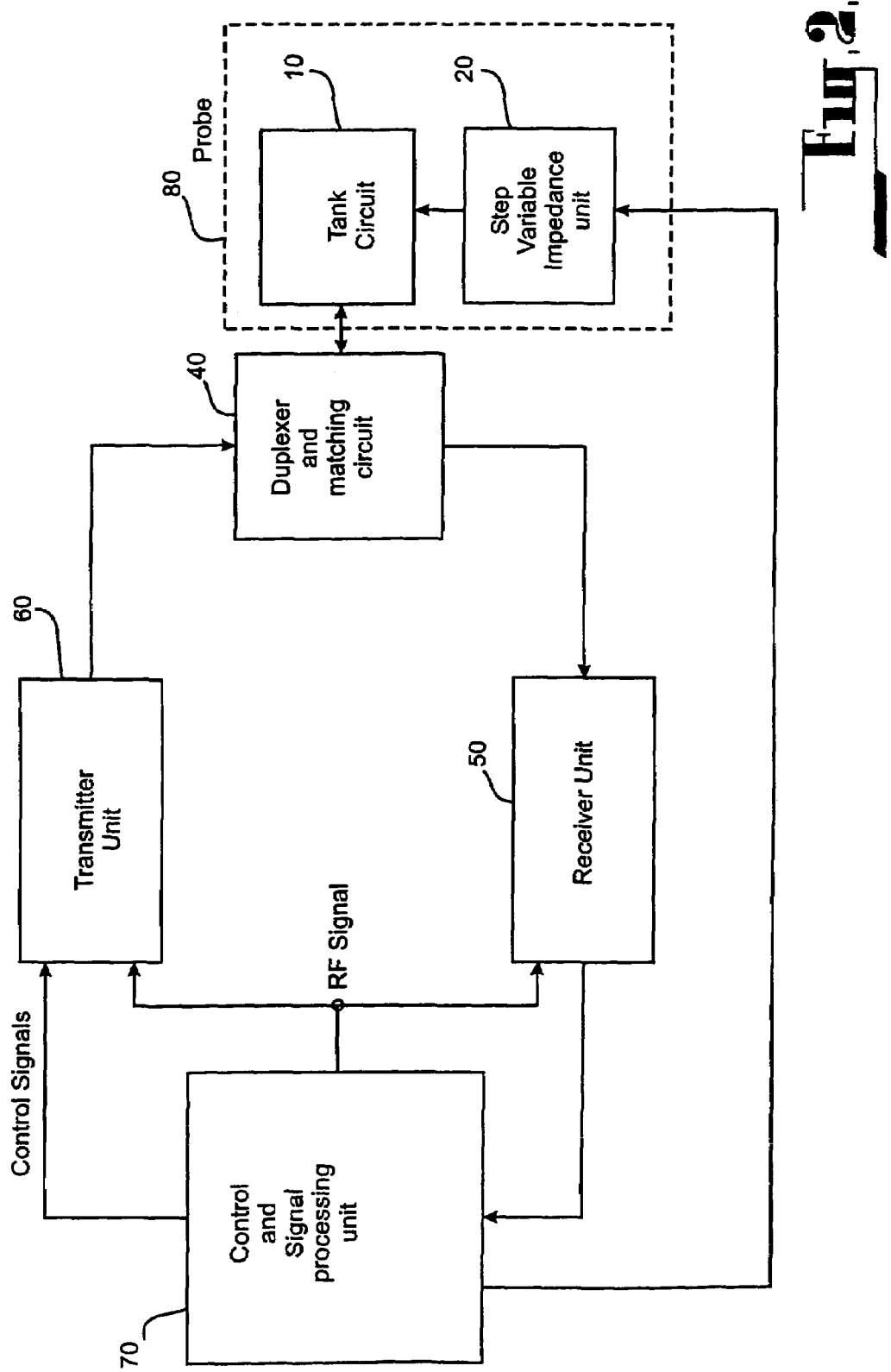
FIG. 2 is a block diagram illustrating an NQR or NMR apparatus for detecting a resonance signal in the specimen, according to a best mode for carrying out the present invention.

FIG. 2 is a block diagram illustrating an NQR or NMR apparatus for detecting a resonance signal in a specimen to be irradiated with a powerful RF magnetic field pulse, according to the best mode of the present invention. As shown in FIG. 2, a probe 80 is connected to a conventional receiver unit 50 and a conventional transmitter unit 60 via a duplexer and matching circuit 40. The probe 80 includes a tank circuit 10 and a variable step impedance unit 20. The tank circuit 10 is tuned to a frequency of interest.

The duplexer and matching circuit 40 is a circuit which switches the probe 80 between the transmit and receive mode as well as matches the receiver unit 50 and transmitter unit 60 to the probe 80.

The transmitter unit 60 generates RF pulses and transfers the pulses to the probe 80. The pulses are transmitted at a relatively high power, typically from several hundred watts to several kilowatts. These RF pulses can excite NQR or NMR signals in the specimen under investigation that is located within the bounds of the probe 80. This signal is amplified and detected by the receiver unit 50 and is then delivered for further mathematical processing into a control and signal processing unit 70, the input of which is connected to the output of the receiver unit 50.

The control and signal processing unit 70 generates an RF signal, which from its first output is transmitted to one of the inputs of the transmitter unit 60 for further formation of the RF carrier for the RF pulses, and to one of the inputs of the receiver unit 50 to act as a reference frequency. The control and signal processing unit 70 also generates signals to another input of the transmitter unit 60 and prescribes parameters for the RF pulses and the control signals, which are transmitted to the input of the variable step impedance unit 20 to change or control the Q-factor of the probe 80 in discrete steps.

The control and signal-processing unit 70 usually consists of a computer, an RF signal source for producing the RF pulses and electronic circuits for producing the control signals, which are not specific to the present invention and so are not described in detail here.

The apparatus shown in FIG. 2, operates in accordance with the following method:

The first control signal is generated at the output of the control and signal processing unit 70 and is input to the variable step impedance unit 20, which sets a certain optimal Q-factor for the probe 80 during the transmitting period when the apparatus is in the transmit mode. The Q-factor for the probe during the transmitting period cannot exceed and is optimally lower than the total or maximum Q for the probe during the receive mode, which occurs immediately after the recovery period. The transmitter unit 60 generates RF pulses and provides the pulses to probe 80 virtually simultaneously with the setting of the Q-factor for the probe to the optimal level.

The second control signal is also generated at the output of the control and signal-processing unit 70 and is similarly sent to the variable step impedance unit 20. The second control signal results in setting the minimal possible Q-factor for the probe 80 during the recovery period immediately following the transmitting period and is lower than the optimal Q-factor set for the probe during the transmitting period and also than the maximal Q-factor set for the probe during the receiving period, immediately after the recovery period.

After the recovery period of the probe 80, a maximum possible total Q factor is then set for the probe in order to achieving high SNR during the receiving period when the apparatus is in the receive mode immediately after the recovery period. This occurs either as a result of control signals sent to the variable step impedance unit 20 being generated from the output of the control and signal processing unit 70 or, in some cases which will be treated in more detail below, without generating any special control signals at all. Simultaneously with setting a high total Q factor, any NQR or NMR signal induced with the probe is directed from the output of the probe 80 to the input of the receiver unit 50, where it is amplified, and sent for further mathematical processing to the control and signal processing unit 70 for detection.

Figure 3:
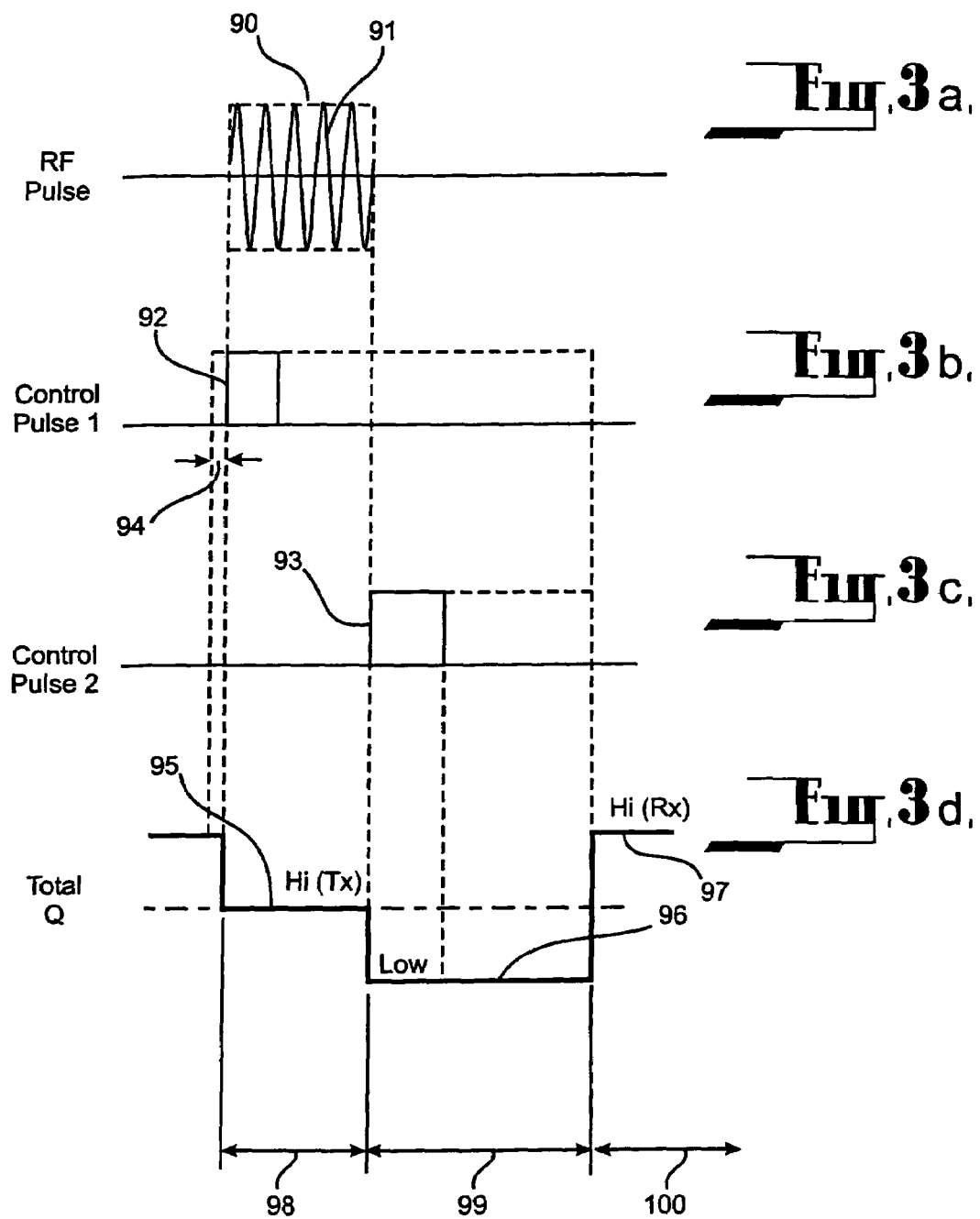

FIGS. 3(*a*), 3(*b*), 3(*c*) and 3(*d*) are diagrams illustrating, respectively, the timing of an RF pulse 90 generated by the transmitter unit 60, the first control signal (control pulse 1) 92 and the second control signal (control pulse 2) 93, generated by the control and signal processing unit 70, and the Q-factor of the probe 80 during these periods. FIGS. 3(*a*), 3(*b*), 3(*c*) and 3(*d*) are not drawn to scale, and are included to further illustrate the general operation of the best mode of the present invention.

FIG. 3(*a*) illustrates RF pulse 90, which has a carrier frequency 91 equal to the resonance frequency of a specimen under investigation. The transmitter unit 60 generates this RF pulse 90.

To set the required value of the total Q-factor of the probe 80 in transmit mode from the output of the control and signal processing unit 70 to the input of the variable step impedance unit 20, the first control signal (control pulse 1) 92 is transmitted, as illustrated in FIG. 3(*b*). This first control signal 92 can be transmitted simultaneously with the RF pulse 90, or earlier as indicated by the interval 94, and is required for setting the optimal Q-factor of the probe 80 during the transmitting period when in the transmit mode.

Figure 5:
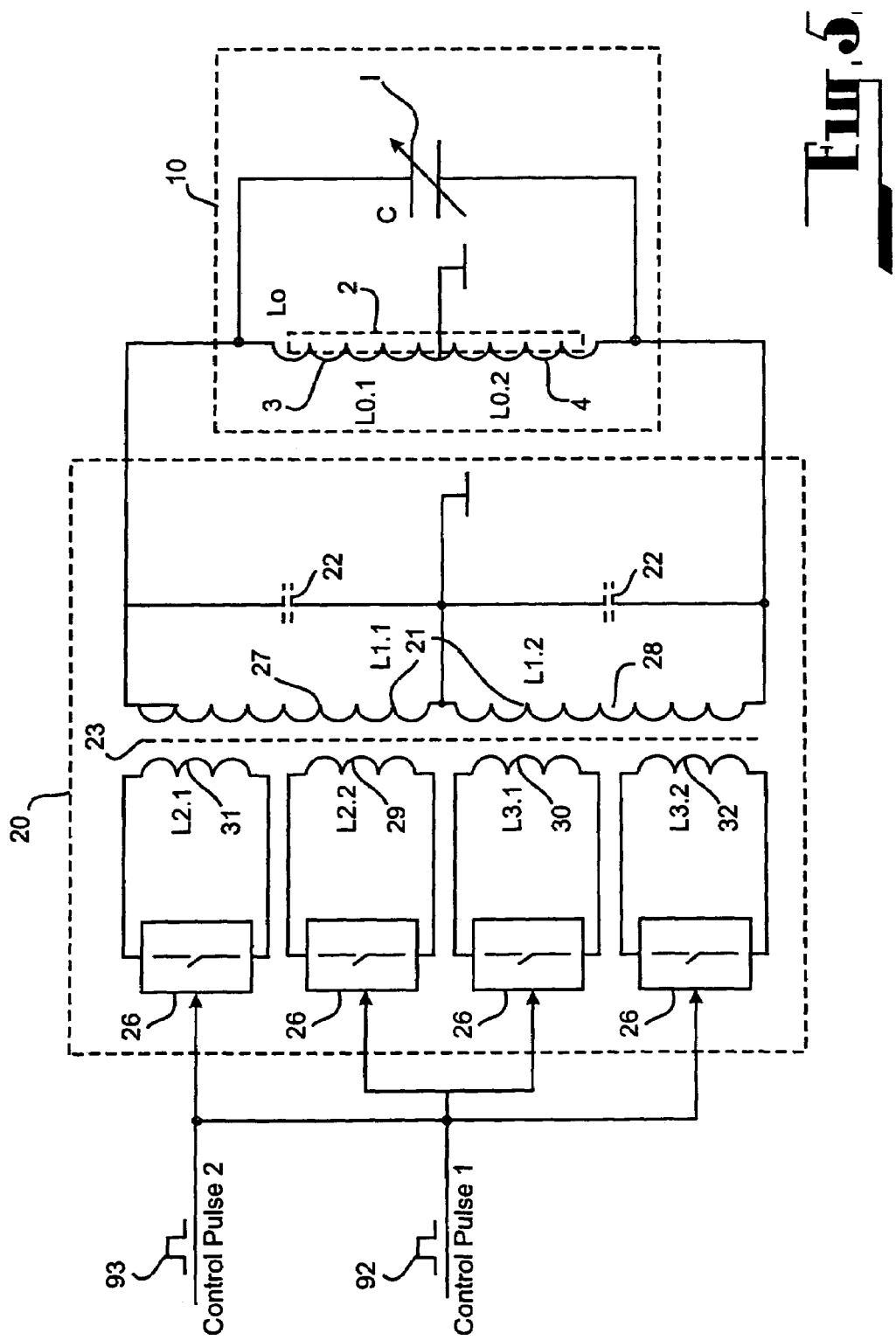
FIG. 5 shows the probe with a three-step variable impedance unit and a balanced coil, according to a second embodiment (type I) of the present invention.

After the end of the RF pulse 90, the second control signal (control pulse 2) 93 is transmitted from the output of the control and signal processing unit 70 to the input of the variable step impedance unit 20, as illustrated in FIG. 5(*c*). This second control signal pulse ensures that a minimal, and indeed the minimum possible, Q-factor for the probe 80 is applied during the recovery period.

FIG. 3(*d*) illustrates the change of the Q-factor for the probe 80 during the transmitting period when in the transmit mode, the recovery period and the receiving period when in the receive mode, respectively. As illustrated in FIG. 3(*d*) during the action of the RF pulse 90 when in the transmit mode 98 an intermediate level of the total Q-factor 95 of the probe 80 is set corresponding to the optimal level Q-factor for the probe for generating an RF pulse of the desired character to excite NQR (or NMR) signals in the sample under investigation. After the end of RF pulse 90, during recovery period 99, the minimal Q-factor 96 for the probe 80 is set. After the end of the recovery period during the receive mode 100, the maximum total Q factor 96 of the probe 80 is set.

Note that in FIGS. 3(*b*) and 3(*c*) a solid line shows signals when control-switching elements 26 based on self-switched elements such as a thyristor or a triac are used, and the interrupted line shows cases when other actively switched elements (such as transistors or actively switched diodes) are used. According to the best mode for performing the invention, the control-switching elements are in the form of elements that have a low capacitive reactance, such as a thyristor and a triacs. Elements such as transistors or diodes are not used for the reason that they inject a parasitic charge into the probe during switching. In the present invention where high Q-factors are used, this parasitic charge can cause the probe to ring anew, as previously discussed.

According to the above mode of the present invention, the use of a variable step impedance unit (as the variable step impedance unit 20) permits the operator to still use a high Q-factor coil in the probe to increase the SNR, but in a more efficient manner that results in a considerable shortening of the recovery period after the effect of the RF pulses. In this manner, it is possible to control the value of the parameters of the RF pulses optimally by setting the required Q-factor for the probe during the transmit mode.

In addition, the above mode of the present invention permits the use of sufficiently high power RF pulses for irradiating a specimen within the bounds of the coil of the probe. The high voltage that appears then in the tank circuit will not result in the damage to the variable step impedance unit.

Several practical embodiments of this mode will now be described. These embodiments fall into two types.

In the first type, type I, this higher voltage rating is achieved by only including inductive elements directly within the tank circuit. As these are passive elements, they can tolerate very high voltages. Actively switched elements, which have limited maximum voltage capacity, are connected only to the control circuits, where the voltage can be lowered to the safe value.

In the second type, type II, the higher voltage rating is achieved by simply connecting the active switching elements in series with the parallel resistive elements allowing a selection of different Q values.

In order to illustrate the effectiveness of these embodiments, an NQR signal emanating from a plastic explosive containing RDX was detected. This measurement used different and predetermined Q values during the transmitting, recovery and receiving periods to optimise the system performance. The probe included a 260 L volume coil with a relatively high Q-factor in the receive mode, in the order of hundreds to a thousand, or more. Essentially, is desirable to use a probe that achieve the highest possible Q-factor, given the sensitivity required to detect an NQR or NMR signal. The duration of the recovery period was reduced by a factor of 7.5 with no measurable increase in the noise floor and this was achieved while still meeting the prerequisite requirements for transmitter bandwidth and stability.

The first embodiment of the best mode of the invention is directed towards an apparatus of the type I arrangement that provides a three-step change to the total Q-factor of a probe.

Figure 4:
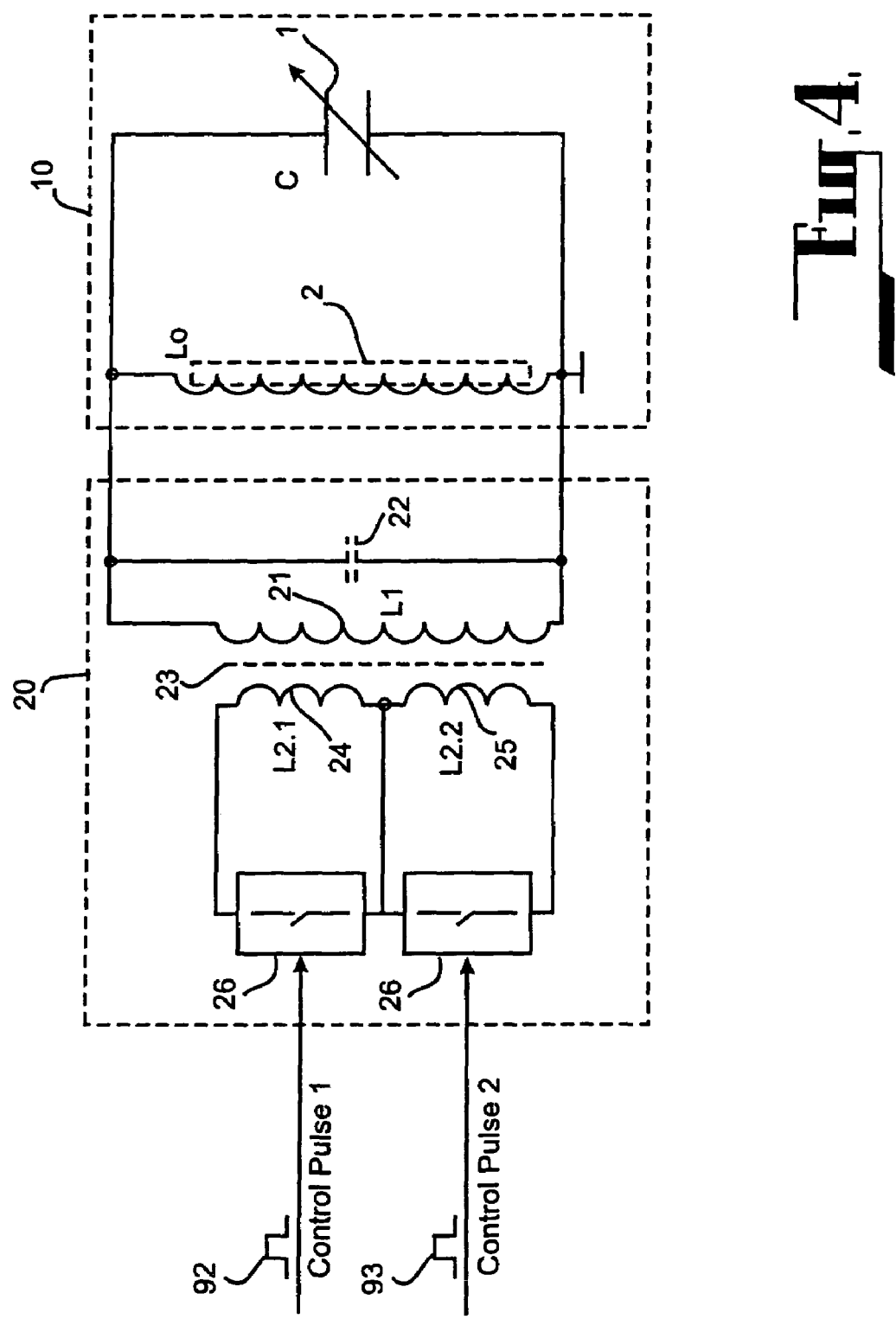
FIG. 4 shows the probe with a three-step variable impedance unit and a conventional coil, according to a first embodiment (type I) of the present invention.

As shown in FIG. 4 the probe 80, includes a tank circuit 10 and variable step impedance unit 20. The tank circuit and the variable step impedance unit are configured to provide a Q-factor setting means for setting the Q-factor of the probe from minimal orders of magnitude to high orders of magnitude, and a Q-factor changing means having low reactance for actively changing the Q-factor of the probe without injecting a parasitic charge therein.

The Q-factor changing means actually comprises the variable impedance unit that combines with the probe to form the tank resonant circuit. The tank circuit is capable of receiving powerful RF pulses applied to the probe to excite an RF magnetic field in the probe during transmitting periods. The value of the total Q-factor of the probe is determined by the impedance of the tank resonant circuit, whereby varying the impedance of the variable impedance unit changes the impedance of the tank resonant circuit.

The tank circuit 10 includes a high Q coil 2, where the sample specimen to be examined is placed, and a variable capacitance 1 for tuning to the predetermined resonance frequency of the substance to be detected that exhibits NOR properties. The variable step impedance unit 20 contains an inductive element 21 formed by a coil wound on core 23, and is connected to the tank circuit 10. Depending on the frequency, the core 23 can be made of iron-powder or ferrite materials.

The impedance of the variable step impedance unit 20 on the core 23 is able to be changed in discrete steps by the provision of two secondary control coils 24 and 25. When these control coils 24 and 25 are switched off, the inductive element 21 has the highest impedance and the probe 80 has the highest or maximum total Q factor that is possible, in this embodiment 1000, which is used in the receive mode. If only one of the coils is short-circuited (eg. control coil 24), the impedance of the inductive element 21 reduces to a predetermined optimal value, in this embodiment 300, thus providing the required decrease in the Q-factor of the probe 80 during the transmitting period when in the transmit mode. When both control coils 24 and 25 are short-circuited the inductive element 21 has the lowest impedance and the probe 80 has the lowest Q-factor, in this embodiment 3, which is used during the recovery period. To short-circuit control coils 24 and 25, control switching elements 26 provided by triacsare used.

To ensure the highest total Q factor of the probe during the receiving period when in the receive mode, the impedance of the inductive element 21 must not be lower than the impedance of the tank circuit 10 at the resonance frequency, but ideally be from 2 to 10 times higher. This is achieved by tuning the inductive element 21, which results in high impedance at the frequency of interest. When using a high quality coil 2 with a Q-factor of around 1000 or higher, and when the impedance of the tank circuit 10 is sufficiently high, the inductive element 21 can be tuned in resonance to the required frequency to achieve a higher impedance. For this purpose either its self-capacitance can be used, or an additional tuning capacitance 22 can be added. A skilled operator can easily accomplish this tuning.

The number of turns in the control coils 24 and 25 can be equal or different and is chosen so as to ensure the required impedance value of the inductive element 21 at the-time of switching. The number of turns in each of the control coils 24 and 25 can be less, equal, but ideally larger, than the number of coils in the inductive element 21, from 2 to 100 times.

The optimal level is sufficiently low to reduce the prescribed recovery period to a period in which transient signals generated within the probe may be dampened and to develop the leading edge of the pulse envelope of the RF pulse during the transmitting period;

Importantly, the optimal level is also sufficiently high to reduce the bandwidth of the RF pulse during the transmitting period so as to mitigate the power expended in amplifying the pulse envelope over its bandwidth.

The maximal level is as high as possible for the probe to receive a signal during the receiving period, after the recovery period, to enable an NQR or NMR signal emitted from a substance within the sample to be detected.

The second embodiment is shown in FIG. 5 and illustrates a first variant of the probe 80 that includes a tank circuit 10 and a variable step impedance unit 20. The specific feature of this particular variant of the probe 80 is that the tank circuit 10 includes a balanced high Q coil 2, which contains two similar coils 3 and 4, where the sample specimen to be investigated is placed. The tank circuit 10 also includes a variable capacitance 1 for tuning to the resonance frequency of the chosen substance to be detected. The variable step impedance unit 20, contains an inductive element 21, which is a coil wound on core 23 and which is divided into two identical coils 27 and 28, and is connected to the tank circuit 10. Depending on the frequency, the core 23 can be made either of iron-powder or ferrite materials.

For changing the impedance of variable step impedance unit 20 in discrete steps, the core 23 has four secondary control coils 29, 30, 31 and 32 wound thereon. It should be noted that the control coil 29 is short-circuited simultaneously with the coil 29, and the coil 31 is short-circuited simultaneously with the coil 32, otherwise this variant of the probe 80 works similarly as the arrangement provided in the first embodiment. For short-circuiting the control coils 29, 30, 31 and 32, control switching elements 26 that are conventional active switching elements, are also used. Any suitable active switching element may be used for this purpose.

The third embodiment is directed towards an apparatus of the type II arrangement that provides a three-step change to the Q-factor of a probe to achieve the best mode of the invention.

Figure 6:
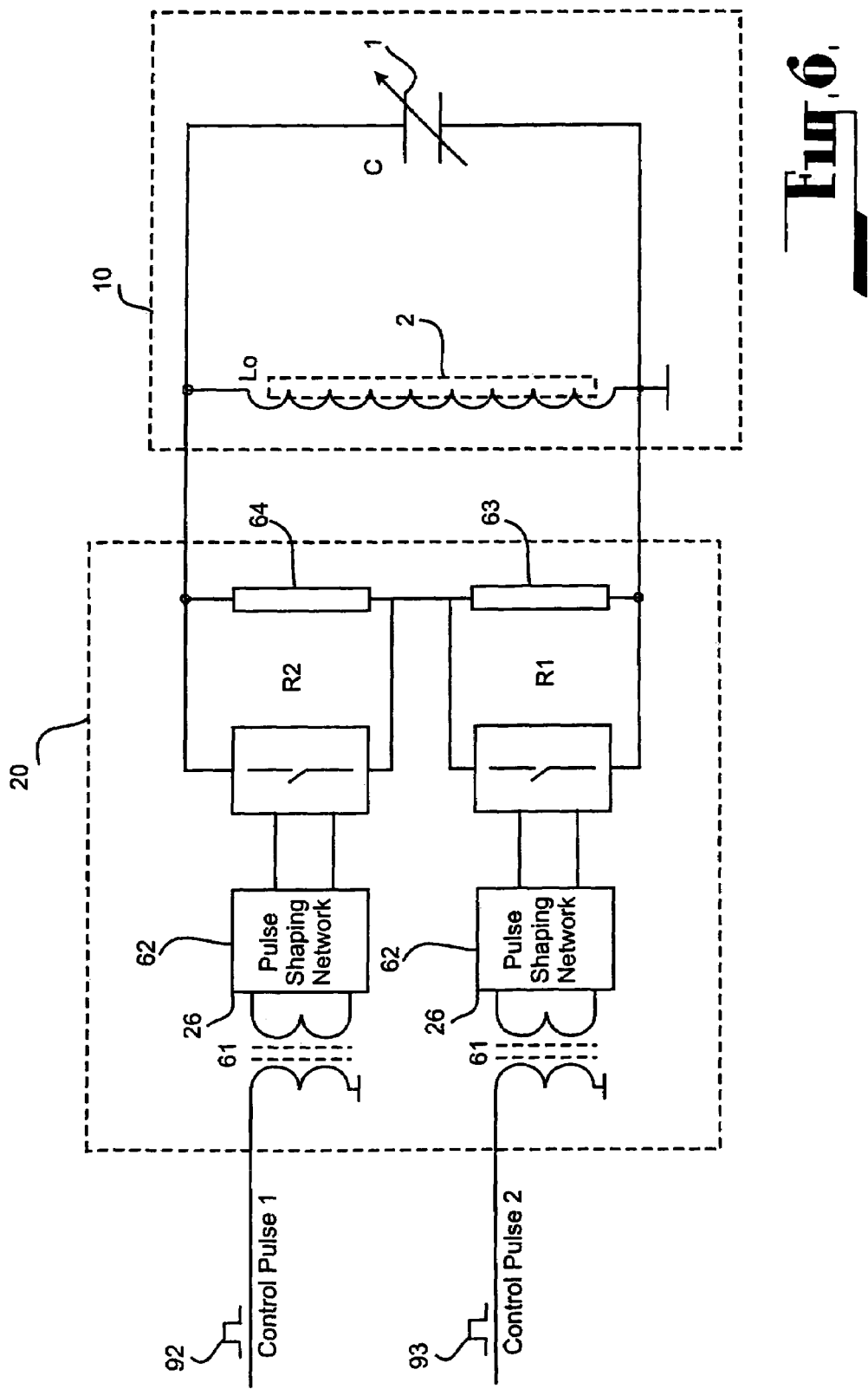
FIG. 6 shows the probe with a three-step variable impedance unit and a conventional coil, according to a third embodiment (type II) of the present invention.

As shown in FIG. 6, the third embodiment illustrates a second variant of the probe 80, which includes a tank circuit 10 and a variable step impedance unit 20. The tank circuit 10 includes a high Q coil 2, where the sample specimen to be examined is placed and a variable capacitance 1 for tuning to the resonance frequency of the substance to be detected. The variable step impedance unit 20 in the type 11 arrangement shown contains pulse transformers 61 to isolate the drive signals, pulse shaping networks 62 to optimise the trigger input to the active switching element 26, and resistive elements (R1) 63 and (R2) 64 located in parallel with the switching elements.

The changes in the impedance of the variable step impedance unit 20 are accomplished via the control signals 92 and 93. The effect of closing either switching element is to practically short-circuit the resistor in parallel. The values of the resistors should be chosen so that the sum of the resistances is sufficient to leave the Q when in the receive mode, relatively unchanged. Thus, the sum of resistances should be higher than the highest achievable impedance across any element in the tank circuit 10 and be ideally 2 to 100 times higher. Either of the resistive elements R1 63 or R2 64 can also be shorted out to reduce the Q to a predetermined 'optimal' value in the transmit mode. A benefit of this design is the possibility of achieving a higher switching voltage than can be achieved by using a single switching element. Any suitable active switching element may be used for this purpose.

Figure 7:
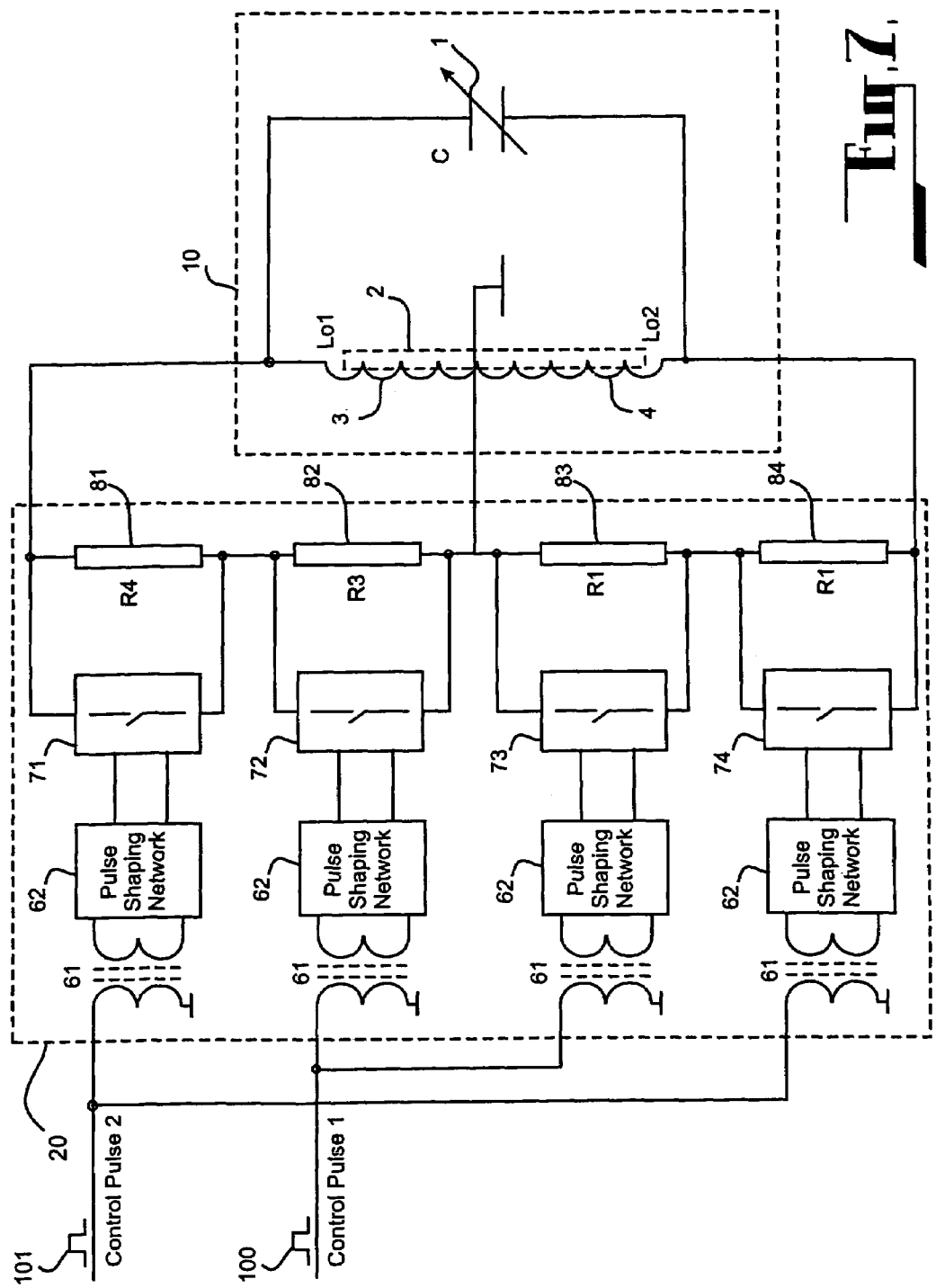
FIG. 7 shows the probe with a three-step variable impedance unit and a balanced coil, according to a fourth embodiment (type II) of the present invention.

The fourth embodiment is shown in FIG. 7 and illustrates a third variant of the probe 80, including a tank circuit 10 and a variable step impedance unit 20. The specific feature of this variant of the probe 80 is that the tank circuit 10 includes a balanced high Q coil 2, which contains two similar coils 3 and 4, where the sample specimen to be investigated is placed. The tank circuit 10 also includes a variable capacitance 1 for tuning to the resonance frequency of the substance to be detected. The variable step impedance unit 20 has four active switching elements 71–74 in parallel with four resistive elements 81–84. A balanced coil design offers other advantages to the best mode than those described in previous embodiments including a further improvement in the switching voltage compared with the design of the third embodiment shown in FIG. 6. Typically, the switches are triggered in pairs via the control signals 100 and 101. Otherwise this variant of the probe 80 works similarly to the third embodiment as shown in FIG. 6. Again, any suitable active switching element may be used.

The fifth to eighth embodiments are directed towards apparatus that provide a four-step change to the total Q-factor of the probe. These are actually preferred to the three-step change arrangements previously described.

These embodiments essentially correspond in order to the preceding embodiments and so the same reference numerals have used to indicate like components.

Firstly with regard to FIG. 2, the four-step change arrangement essentially involves the control and signal-processing unit 70 producing three sets of control signals, as opposed to two in the three-step arrangement. The first control signal is the same as in the three-step arrangement. However the second control signal results in setting of a first minimal Q-factor for the probe 80 and the third control signal results in setting of a second minimal Q-factor, which is lower than the first minimal Q-factor.

Essentially, the variable step impedance unit 20 is controlled to change the Q-factor of the probe to actively step the impedance of the probe down after said transmitting period to provide the first then the second minimal levels of the Q-factor for the probe for some period of time during the recovery period.

Figure 8:
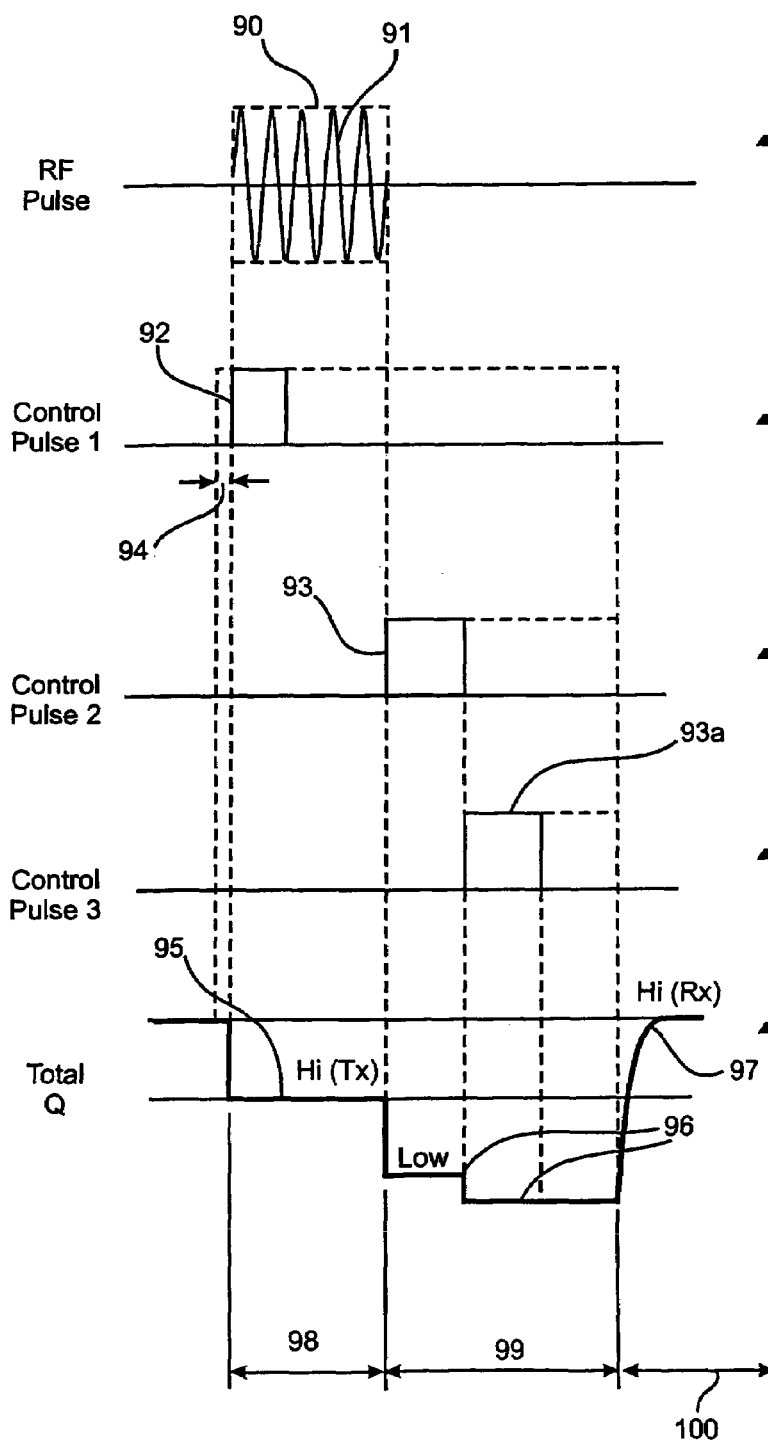

The process is better illustrated in FIG. 8 where FIGS. 8(*a*), 8(*b*), 8(*c*), 8(*d*) and 8(*e*) are diagrams illustrating, respectively, the timing of an RF pulse 90 generated by the transmitter unit 60, the first control signal (control pulse 1) 92, the second control signal (control pulse 2) 93 and the third control signal (control pulse 3) 93*a*, generated by the control and signal processing unit 70, and the Q-factor of the probe 80 during these periods.

After the end of the RF pulse 90, the second control signal (control pulse 2) 93 is transmitted from the output of the control and signal processing unit 70 to the input of the variable step impedance unit 20, as illustrated in FIG. 8(*c*). This second control signal pulse ensures that a minimal, Q-factor for the probe 80 is applied during the first part of the recovery period.

After this has occurred, the third control signal (control pulse 3) 93*a* is transmitted from the output of the control and signal processing unit 70 to the input of the variable step impedance unit 20, as illustrated in FIG. 8(*d*). This third control signal pulse ensures that a minimal Q-factor for the probe 80 is applied during the second part of the recovery period.

Importantly, the four-step arrangement provides for superior protection of the control-switching elements from the high voltages that arise from switching from a relatively high Q-factor to a relatively low Q-factor. This allows construction of a reliable Q-switch which does not repeatedly breakdown.

The fifth embodiment is substantially the same as the first embodiment, being directed towards an apparatus of the type I arrangement, but which provides for a four-step change to the total Q-factor of the probe.

Figure 9:
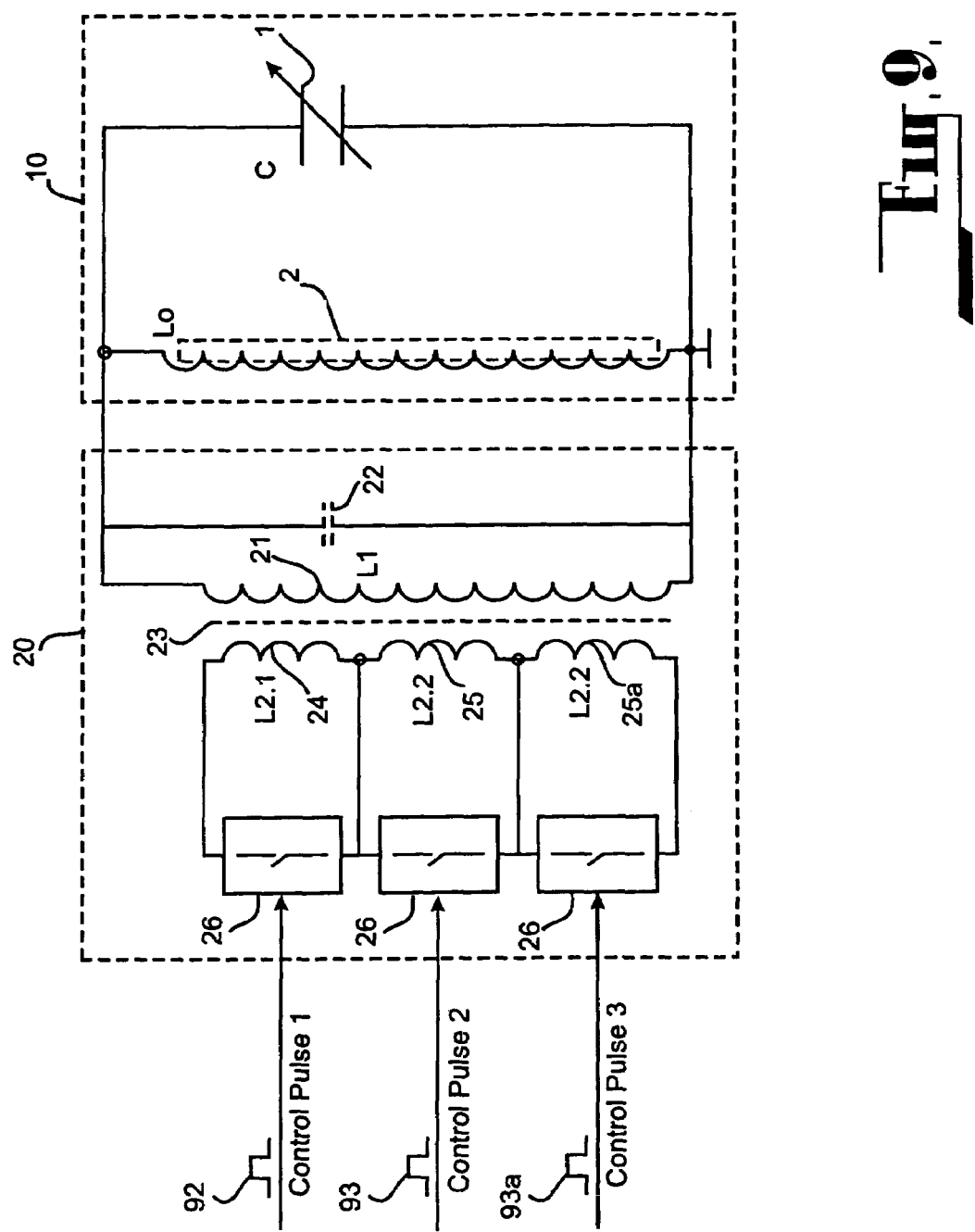
FIG. 9 shows the probe with a four-step variable impedance unit and a conventional coil, according to a fifth embodiment (type I) of the present invention.

As shown in FIG. 9, the apparatus is essentially the same as that of the first embodiment illustrated in FIG. 4, except that the impedance of the variable step impedance unit 20 on the core 23 is able to be changed in discrete steps by the provision of three secondary control coils 24, 25 and 25*a*. When these control coils 24, 25 and 25*a* are switched off, the inductive element 21 has the highest impedance and the probe 80 has the highest or maximum total Q factor that is possible, which is used in the receive mode. If only one of the coils is short-circuited (eg. control coil 24), the impedance of the inductive element 21 reduces to a predetermined optimal value, thus providing the required decrease in the Q-factor of the probe 80 during the transmitting period when in the transmit mode. When all control coils 24, 25 and 25*a* are short-circuited the inductive element 21 has the lowest impedance and the probe 80 has the lowest Q-factor, which is used during the recovery period. To short-circuit control coils 24, 25 and 25*a*, control switching elements 26 provided by conventional active switching elements are used. Any suitable active switching element may be used.

The number of turns in the control coils 24, 25 and 25*a* can be equal or different and is chosen so as to ensure the required impedance value of the inductive element 21 at the time of switching. The number of turns in each of the control coils 24, 25 and 25*a* can be less, equal, but ideally larger, than the number of coils in the inductive element 21, from 2 to 100 times.

For changing the impedance of variable step impedance unit 20 in discrete steps, the core 23 has six secondary control coils 29, 30, 31, 31*a*, 32 and 32*a* wound thereon. It should be noted that the control coil 29 is short-circuited simultaneously with the coil 30, the coil 31 is short-circuited simultaneously with the coil 32, and the coil 31*a* is short-circuited simultaneously with the coil 32*a*, otherwise this variant of the probe 80 works similarly as the arrangement provided in the first embodiment. For short-circuiting the control coils 29, 30, 31, 31*a*, 32 and 32*a*, control switching elements 26 that are conventional active switching elements, are also used. Any suitable active switching element may be used for this purpose.

The switching control elements 26 have a low capacitive reactance and again are in the form of triacs.

Importantly, the triacs 26 are coupled to inductive elements during the period that the impedance of the probe is stepped down to the first minimal level to protect the triacs from voltage applied thereto pursuant to the resultant change in impedance. They are then decoupled from the inductive elements during the period that the impedance of the probe is stepped down to the second minimal level to minimise the inductance of the triacs and thus the reactance of the variable impedance. This minimises the impedance of the probe to change the Q-factor to the second minimal level during the recovery period.

In the present embodiment, the first minimal level provides a Q-factor of 3 and the second minimal provides a Q-factor of 0.6.

Essentially, the first minimal level enables the voltage to be brought down from that generated when changing the Q-factor from the optimal level to a level that would no longer be destructive to the triacs, using the inductive elements to protect them. The inductive elements are removed from the triacs to reduce their reactance and thus achieve the lowest Q possible to dampen any transient signals.

The triacs have an innately long recovery period when activated again to increase the Q-factor to the maximum. This quite advantageous as the control-switching elements cannot be switched on too quickly, otherwise they would create another signal that would be capacitively coupled with the coil, creating ringing anew.

Figure 10:
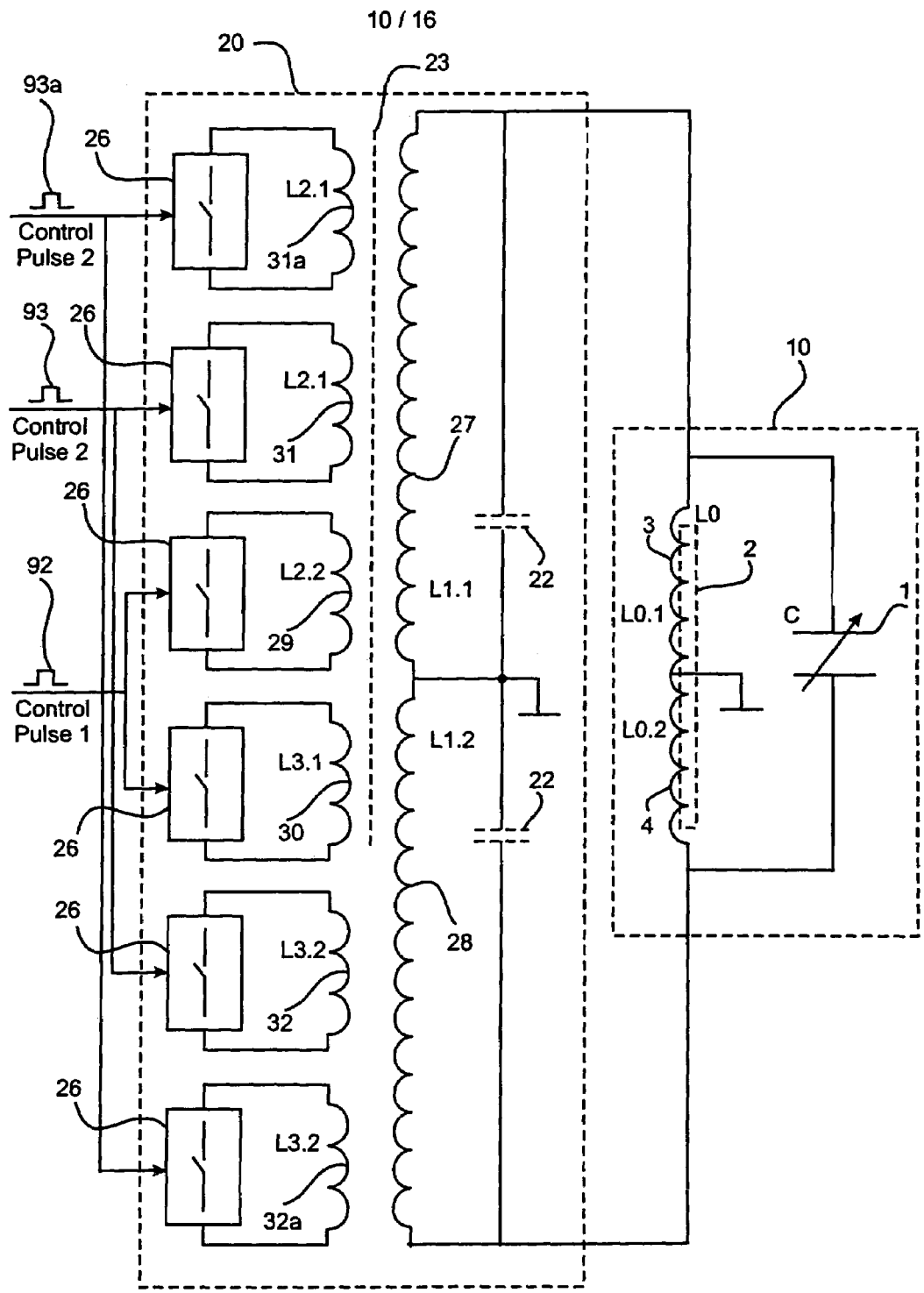
FIG. 10 shows the probe with a four-step variable impedance unit and a balanced coil, according to a sixth embodiment (type I) of the present invention.

The sixth embodiment is substantially the same as the second embodiment and is shown in FIG. 10. For changing the impedance of variable step impedance unit 20 in discrete steps, the core 23 has six secondary control coils 29, 30, 31, 31a, 32 and 32a wound thereon. It should be noted that the control coil 29 is short-circuited simultaneously with the coil 30, the coil 31 is short-circuited simultaneously with the coil 32, and the coil 31a is short-circuited simultaneously with the coil 32a, otherwise this variant of the probe 80 works similarly as the arrangement provided in the first embodiment. For short-circuiting the control coils 29, 30, 31, 31a, 32 and 32a, control switching elements 26 that are conventional active switching elements, are also used.

Figure 11:
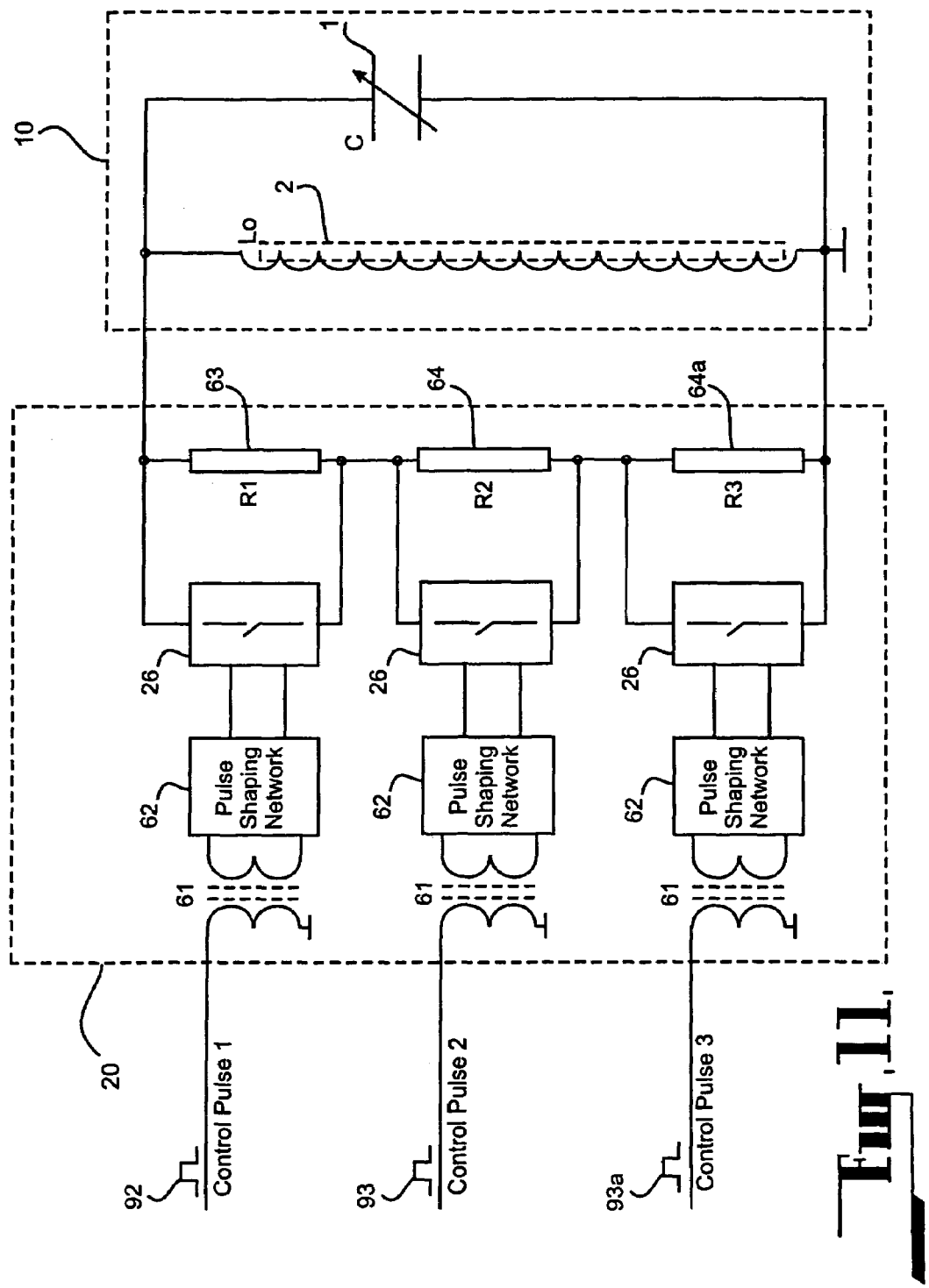
FIG. 11 shows the probe with a four-step variable impedance unit and a conventional coil, according to a seventh embodiment (type II) of the present invention.

The seventh embodiment is directed towards an apparatus of the type II arrangement that provides a four-step change to the Q-factor of a probe, as shown in FIG. 11. The embodiment is substantially the same as the second embodiment with the variable step impedance unit 20 being in the type II arrangement. This arrangement however, contains pulse transformers 61 to isolate the drive signals, pulse shaping networks 62 to optimise the trigger input to the active switching element 26, and resistive elements (R1) 63, (R2) 64 and (R3) 64a located in parallel with the switching elements.

The changes in the impedance of the variable step impedance unit 20 are accomplished via the control signals 92, 93 and 93a. The effect of closing either switching element is to practically short-circuit the resistor in parallel. The values of the resistors should be chosen so that the sum of the resistances is sufficient to leave the Q when in the receive mode, relatively unchanged. Thus, the sum of resistances should be higher than the highest achievable impedance across any element in the tank circuit 10 and be ideally 2 to 100 times higher. Either of the resistive elements R1 63, R2 64 or R3 64a can also be shorted out to reduce the Q to a predetermined 'optimal' value in the transmit mode. A benefit of this design is the possibility of achieving a higher switching voltage than can be achieved by using a single switching element.

Figure 12:
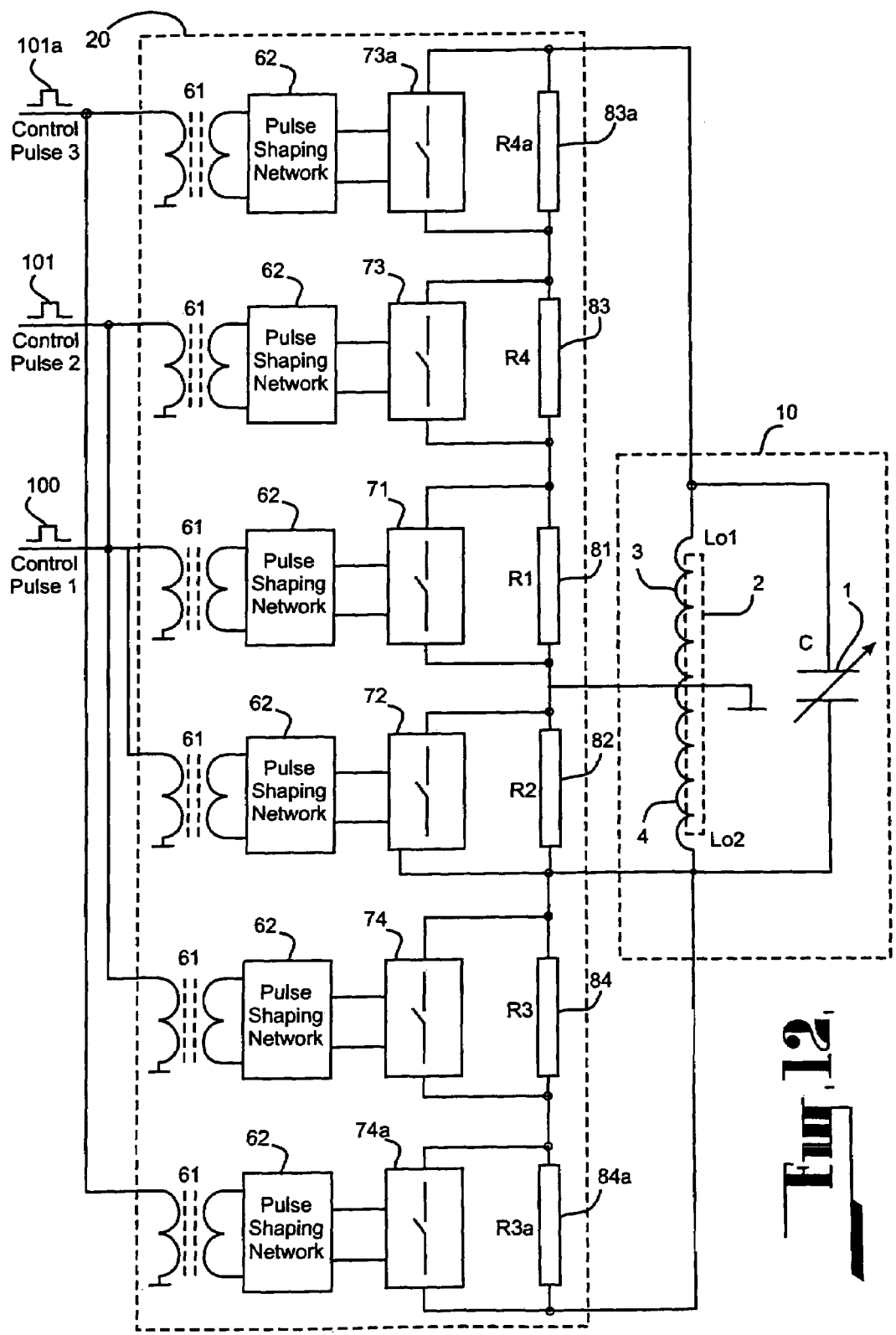
FIG. 12 shows the probe with a four-step variable impedance unit and a balanced coil, according to an eighth embodiment (type II) of the present invention.

The eighth embodiment is shown in FIG. 12 and illustrates another variant of the probe 80, including a tank circuit 10 and a variable step impedance unit 20. The variable step impedance unit 20 has six active switching elements 71, 72, 73, 73a, 74 and 74a in parallel with six resistive elements 81, 82, 83, 83a, 84 and 84a. A balanced coil design offers other advantages to the best mode than those described in previous embodiments including a further improvement in the switching voltage compared with the design of the third embodiment shown in FIG. 6. Typically, the switches are triggered in pairs via the control signals 100, 101 and 101a. Otherwise this variant of the probe 80 works similarly to the third embodiment as shown in FIG. 12. Again, any suitable active switching element may be used.

The ninth embodiment is directed towards an apparatus of the type I arrangement that provides multi-step changes to the Q-factor of a probe to achieve the best mode of the invention.

Figure 13:
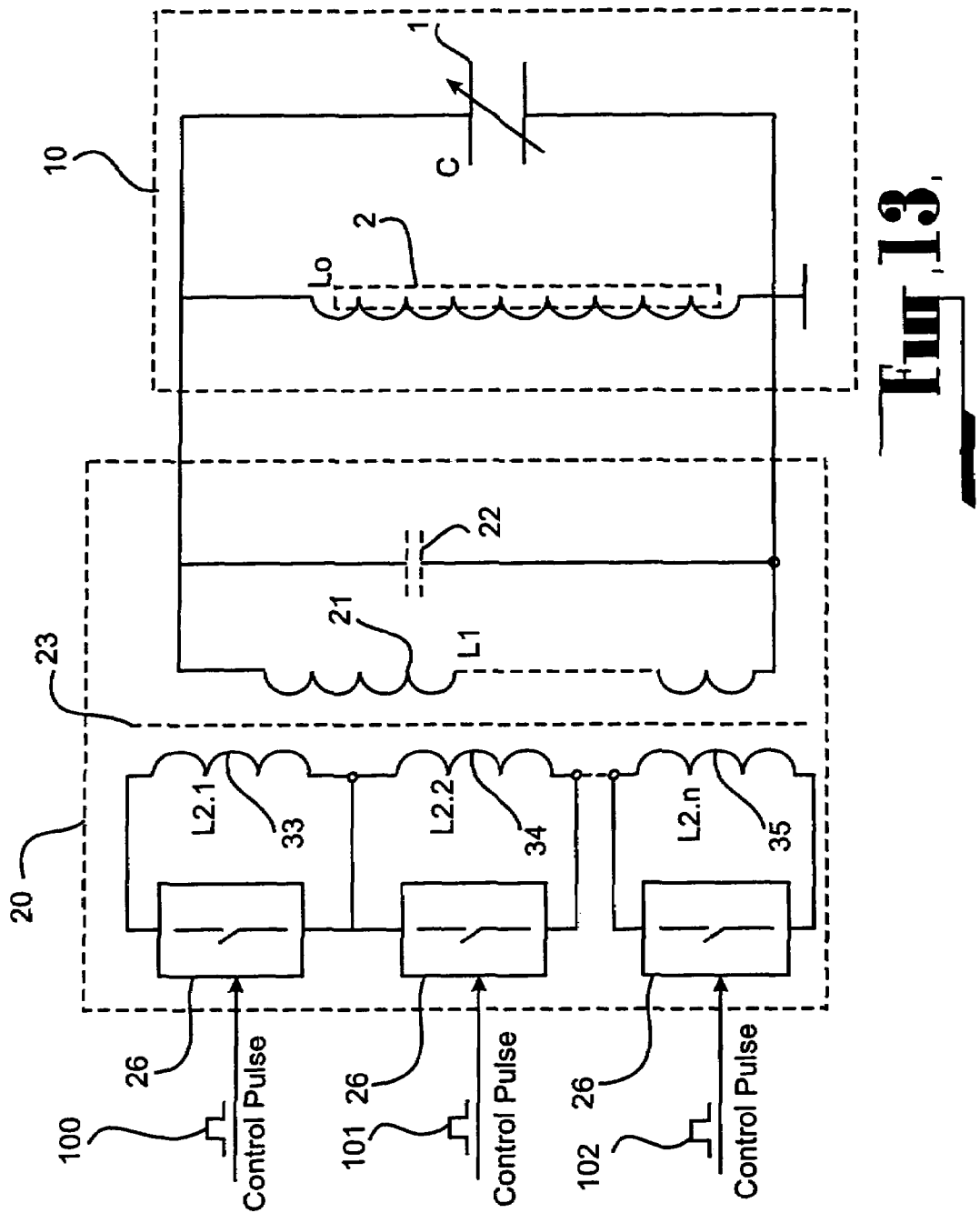
FIG. 13 shows the probe with a multi-step variable impedance unit and a conventional coil, according to a ninth embodiment (type I) of the present invention.

As shown in FIG. 13 the ninth embodiment illustrates a further variant of the probe 80, including a tank circuit 10 and a variable step impedance unit 20. The tank circuit 10 includes a high Q coil 2, where the sample specimen to be investigated is placed and a variable capacitance 1 for tuning to the resonance frequency of the substance to be detected. The variable step impedance unit 20 contains an inductive element 21, which is a coil wound on core 23, and is connected to the tank circuit 10. Depending on the frequency, the core 23 can be made of iron-powder or ferrite materials. The difference of this variant of the probe 80 from those described in the preceding embodiments is that it allows for changes in the Q-factor of probe 80 in multiple steps. This is achieved by making corresponding changes in the impedance of the core 23 within the variable step impedance unit 20. Moreover, for a general case, there are n (3 or more) secondary control coils 33, 34 and 35. When these control coils 33, 34 and 35 are switched off, the inductive element 21 has the highest impedance and the probe 80 has the highest total Q-factor possible, which is used in the receive mode. Short-circuiting control coils 33, 34 and 35 results in decreasing the total Q-factor of the probe 80. For short-circuiting the control coils 33, 34 and 35, control switching elements 26, which are conventional active switching elements, are used. Any suitable active switching element may be used, but in the present embodiment the element is a thyristor, and more particularly, a triac.

Short-circuiting the control coils 33, 34 and 35 can be accomplished according to any rule required for the optimum detection of NQR or NMR signals, by sending corresponding control signals (control pulses) 100, 101 and 102 to the inputs of control switching elements 26. This ensures a more flexible and smooth control of the changing Q-factor for the probe 80 during NQR or NMR signal detection. Otherwise the operation of this variant of the probe 80 is similar to the first embodiment described with reference to FIG. 3.

The number of turns in the control coils 33, 34 and 35 can be similar or different to each other and is chosen to ensure the required value of impedance, and changes in relation thereto, of the inductive element 21 when switching. The number of turns in each of the control coils 33, 34 and 35 can be less, equal but ideally higher, being from 2 to 100 times higher, than the number of turns in the inductive element 21.

Multi-level Q-switching may be required for performing different tasks. For instance, there maybe two Q levels at the beginning of the recovery period to reduce the voltage effects upon active elements within the circuit as in FIG. 3(e) and then this maybe followed by more two Q levels to arrive back to the receive Q level instead of only one level. This last two Q level stage may be required to speed up the switching of the Q back to the best possible receive Q so that the acquisition of the weak NQR (or NMR) signal can begin sooner than would otherwise occur.

Figure 14:
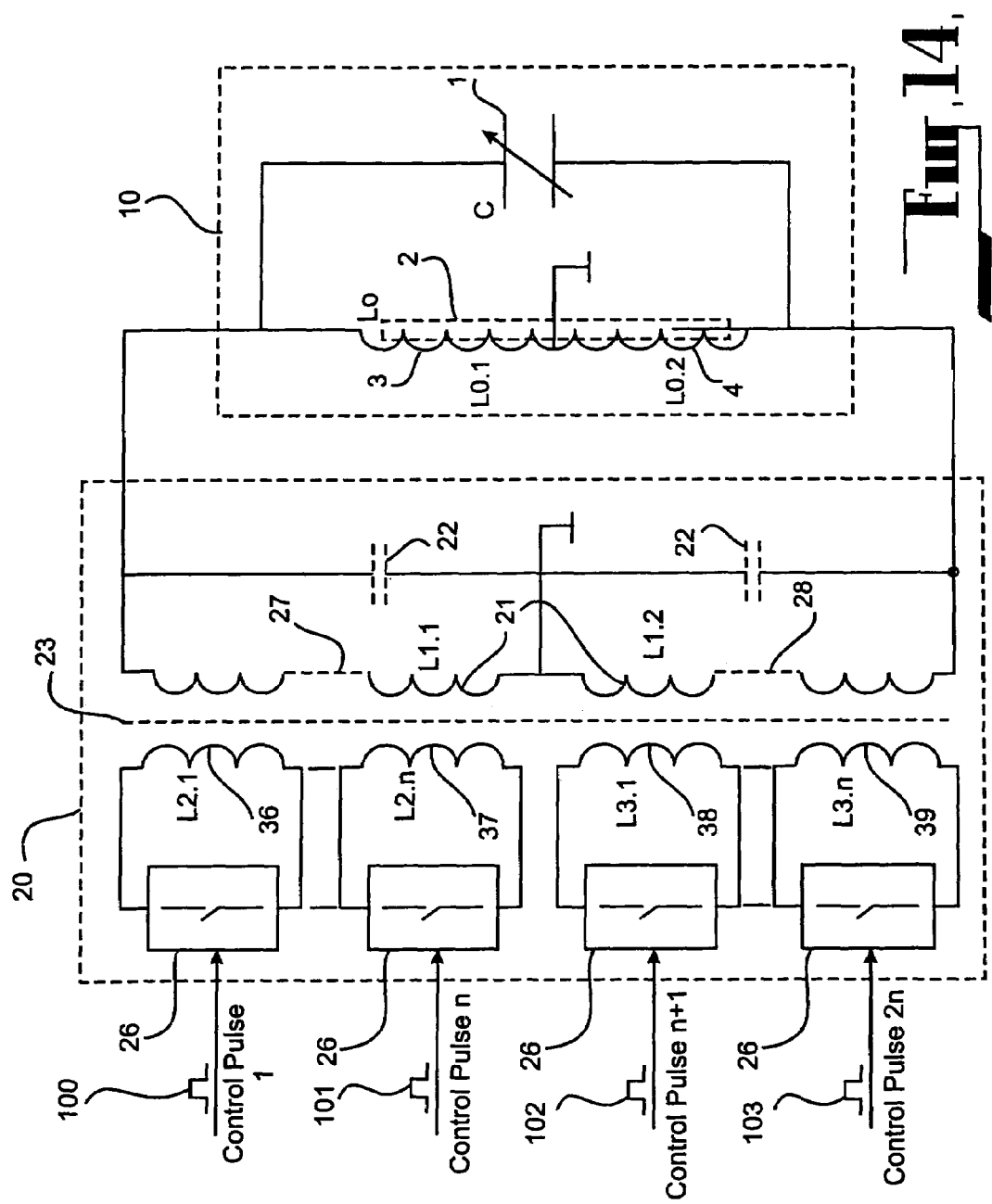
FIG. 14 shows the probe with a multi-step variable impedance unit and a balanced coil, according to a tenth embodiment (type I) of the present invention.

The tenth embodiment is described with reference to FIG. 14, which illustrates another variant of the probe 80, including a tank circuit 10 and a variable step impedance unit 20. The distinguishing feature of this variant of the probe 80 as compared to the features of the third embodiment as described with reference to FIG. 6, is that the tank circuit 10 includes a balanced high Q coil 2, containing two identical coils 3 and 4, where the sample specimen to be investigated is placed. The tank circuit 10 also includes a variable capacitance 1 for tuning to the resonance frequency of the substance to be detected. The variable step impedance unit 20 contains an inductive element 21, which is a coil wound on a core 23 and which is divided into two identical coils 27 and 28, and is connected to the tank circuit 10. For effecting numerous changes in steps of the impedance of the variable step impedance unit 20 on the core 23, for a general case, there are provided 2n (6 or more) secondary control coils 36, 37 and 38, 39. Short-circuiting the control coils 36, 37 and 38, 39 is performed by control switching elements 26, similar to those described above. Effecting the short-circuiting of the control coils 36, 37 and 38, 39 can be achieved according to any rule required for the optimum detection by sending corresponding control signals (control pulses) 100, 101 and 102, 103 to the inputs of the control switching elements 26. The number of turns in the control coils 36, 37 and 38, 39 can be equal or different to each other, and is selected so as to ensure the required impedance value of the inductive element 21 at the appropriate time when they are switched. The number of turns in each of 2n control coils 36, 37 and 38, 39 can be less, equal, but ideally larger, typically from 2 to 100 times larger than the number of turns in the inductive element 21.

The principle of operation of the sixth embodiment of the apparatus insofar as the probe 80 is concerned, as well as the purpose and structural features of its other elements are similar to those previous embodiments described above.

The eleventh embodiment is directed towards an apparatus of the type II arrangement that provides multi-step changes to the Q-factor of a probe to achieve the best mode of the invention.

Figure 15:
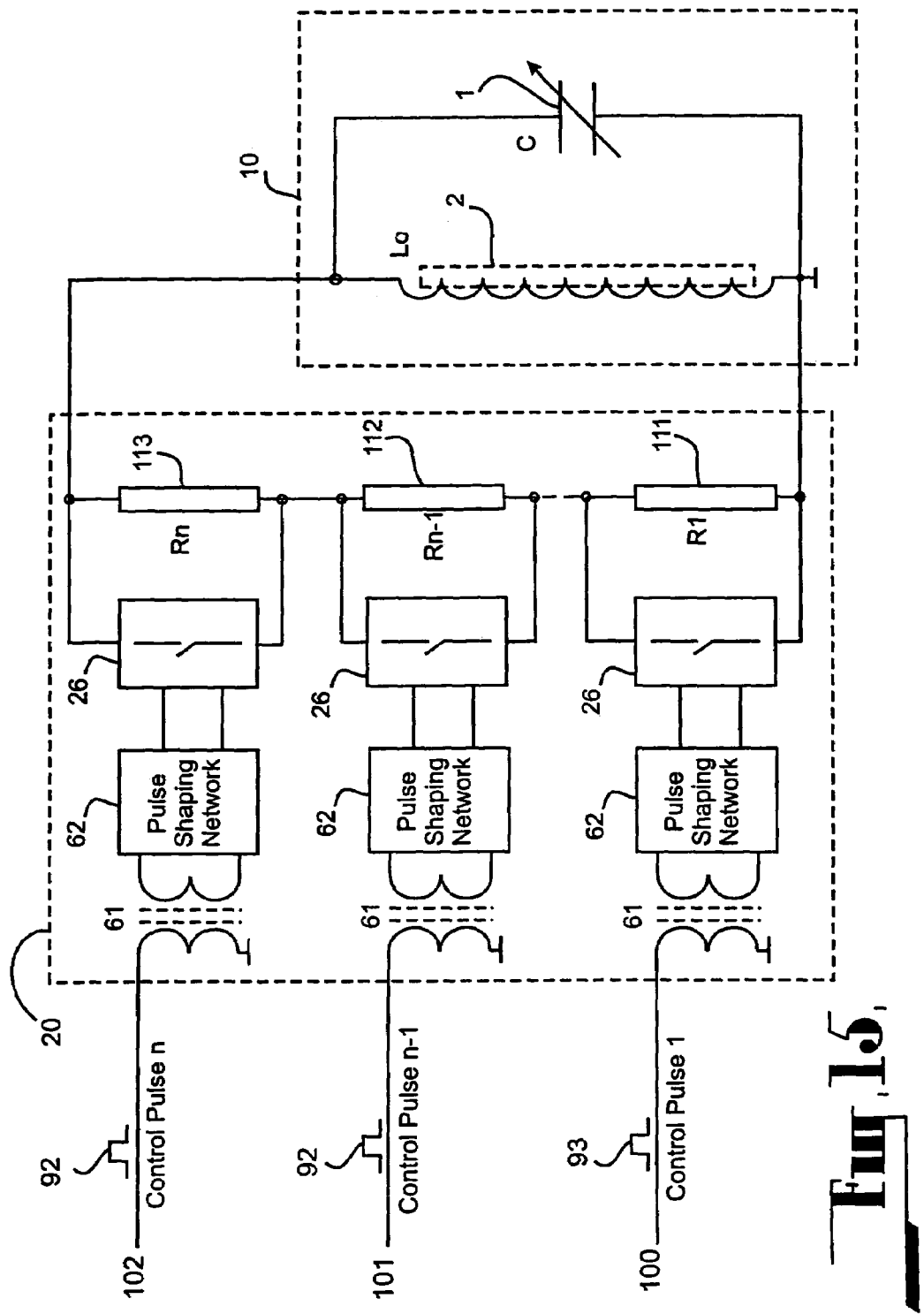
FIG. 15 shows the probe with a multi-step variable impedance unit and a conventional coil, according to an eleventh embodiment (type II) of the present invention.

As shown in FIG. 15 the eleventh embodiment illustrates another variant of the probe 80, including a tank circuit 10 and a variable step impedance unit 20. The tank circuit 10 includes a high Q coil 2, where the sample specimen to be investigated is placed and a variable capacitance 1 for tuning to the resonance frequency of the substance to be detected. The variable step impedance unit 20 in this case consists of a series of active switching elements each in parallel with a resistive element and is switched by an isolated drive pulse. This drive pulse is derived from a pulse transformer and pulse-shaping network. Again, short-circuiting the resistors R1 111 to Rn 113 results in decreasing the Q-factor of probe 80. An additional benefit of this design compared with previous embodiments is the possibility of achieving a higher switching voltage than can be achieved by a single switching element. Any suitable active switching element may be used for this purpose. As described in the fifth sixth embodiment with reference to FIG. 9, the short-circuiting of the coils 36 to 39 by the active switching elements 26 can be accomplished according to any rule required for the optimum detection of the NQR or NMR signals by sending corresponding control signals (control pulses) 100, 101 and 102 to the inputs of the control switching elements 26. This ensures a more flexible and smooth control of the Q-factor of the probe 80 during NQR or NMR signal detection. Otherwise the operation of this variant of probe 80 is similar to the variant described in the third embodiment in relation to FIG. 6.

Figure 16:
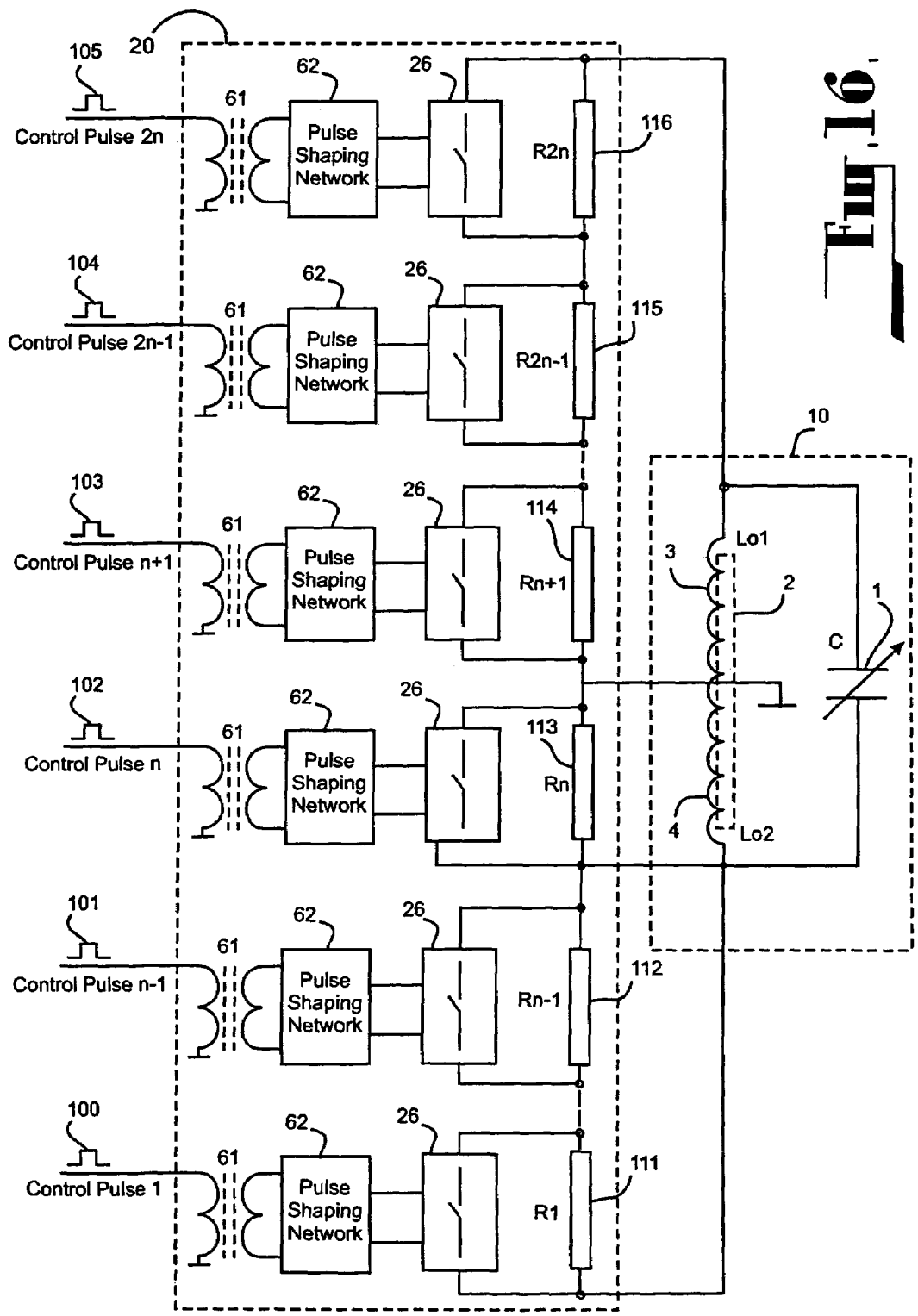
FIG. 16 shows the probe with a multi-step variable impedance unit and a balanced coil, according to a twelfth embodiment (type II) of the present invention.

The twelfth embodiment is described with reference to FIG. 16, which illustrates a further variant of the probe 80, including a tank circuit 10 and a variable step impedance unit 20. The distinguishing feature of this variant of the probe 80 as compared to the features of the seventh embodiment as described with reference to FIG. 10 is that the tank circuit 10 includes a balanced high Q coil 2, containing two identical coils 3 and 4, where the sample specimen to be investigated is placed. The tank circuit 10 also includes a variable capacitance 1 for tuning to the resonance frequency of the substance to be detected. The variable step impedance unit 20 is also connected to the tank circuit 10. For effecting numerous (n) changes in steps of the impedance of the variable step impedance unit 20, there exist 2n (6 or more) active switching elements 26, in parallel with 2n resistive elements similar to those described above. Short-circuiting of the resistive elements can be performed according to any rule required for achieving optimum detection of the NQR or NMR signals by sending corresponding control signals (control pulses) 100, 101 and 102, 103 to the inputs of the control switching elements 26. A balanced coil design offers other advantages including a further improvement in the switching voltage compared with the design of the eleventh embodiment described with reference to FIG. 15. Once again, any suitable active switching element may be used.

According to the eleventh and twelfth embodiments of the present invention, using a multi-step variable impedance unit as the variable step impedance unit 20 provides additional advantages, namely a broadening of the scope of Q-factor switching possibilities in NQR or NMR. Thus it becomes possible to make a smoother change of the total Q-factor of a probe during the detection process at any of its stages. It is also possible to control the required value of the total Q-factor of a probe, which usually depends on the type and size of the sample specimen placed in the coil of the probe.

It should be appreciated, however, that the list of embodiments is not considered be exhaustive, and indeed the scope of the invention is not limited thereby. For example, in all the specific embodiments of the invention, the tank circuit 10 has been shown as a parallel resonant circuit. In practice, other embodiments of the invention could be envisaged and adapted to work equally as well with any tank circuit, including for example a series resonant circuit, by any one skilled in the art.

It should also be appreciated that although the embodiments have been specifically described for direct application using NQR techniques, these embodiments are just as easily applied to NMR using NMR techniques.

The invention claimed is:

1. An apparatus for changing the Q-factor of a probe, having an impedance that can be varied to achieve a Q-factor of minimal orders of magnitude and a Q-factor of high orders of magnitude, for irradiating a sample with RF energy during transmitting periods and detecting an NQR or NMR signal emitted from a substance contained within the sample from a signal received by the probe during receiving periods, the apparatus comprising:

Q-factor setting circuit for setting the Q-factor of a probe from minimal orders of magnitude to high orders of magnitude;

Q-factor changing circuit having low reactance for actively changing the Q-factor of the probe without injecting a parasitic charge therein; and control circuit to control said Q-factor changing circuit so as to change the Q-factor of the probe in accordance with said Q-factor setting circuit to:

(i) an optimal level during a prescribed transmitting period of an RF pulse for irradiating the sample with said RF energy;

(ii) a minimal level during a prescribed recovery period immediately following said transmitting period to rapidly dampen transient signals from the probe; and (iii) a maximal level during a prescribed receiving period for detecting an NQR or NMR signal from the target substance if present, immediately following the recovery period;

said optimal level being:

(a) sufficiently low to reduce said prescribed recovery period to a period in which said transient signals may be dampened and to develop the leading edge of the pulse envelope of said RF pulse during said transmitting period; and (b) sufficiently high to reduce the bandwidth of said RF pulse during said transmitting period and so mitigate the power expended in amplifying the pulse envelope over the bandwidth; and said maximal level being sufficiently high for the probe to receive a signal during the receiving period, after the recovery period, to enable an NQR or NMR signal emitted from a substance within the sample to be detected;

wherein said control circuit is adapted to control said Q-factor changing circuit in accordance with said Q-factor setting circuit to actively step the impedance of the probe down in a plurality of stages after said transmitting period for some period of time during the recovery period to provide the requisite minimal level of the Q-factor for the probe.

2. An apparatus as claimed in claim 1, wherein the reactance of the Q-factor changing circuit that is low is the capacitive reactance thereof.

3. An apparatus as claimed in claim 1, wherein the Q-factor changing circuit comprises a variable impedance unit that combines with the probe to form a tank resonant circuit that is capable of receiving powerful RF pulses applied to the probe to excite an RF magnetic field in the probe during transmitting periods, the value of the total Q-factor of the probe being determined by the impedance of the tank resonant circuit, whereby varying the impedance of the variable impedance unit changes the impedance of the tank resonant circuit.

4. An apparatus as claimed in claim 1, wherein the Q-factor setting circuit is controlled to set the Q-factor of the probe during the recovery period to orders of magnitude of tenths to be considerably lower than the Q-factor of the probe before and after the recovery period so as to completely dampen the transient signals and provide for a rapid ring-down in the probe.

5. An apparatus as claimed in claim 1, wherein the impedance of the probe is stepped down to a first minimal level of magnitude during a first period of the recovery period immediately following said transmitting period and then to a second minimal level of magnitude lower than said first minimal level during a subsequent period of the recovery period, prior to said receiving period.

6. An apparatus as claimed in claim 5, wherein said first minimal level of the Q-factor is in orders of magnitude of ones, and said second minimal level of the Q-factor is in orders of magnitude of tenths.

7. An apparatus as claimed in claim 1, wherein said Q-factor setting circuit comprises a variable step impedance element and switching control elements that are able to be actively switched to step down the impedance of the probe to provide the requisite minimal level of the Q-factor of the probe.

8. An apparatus as claimed in claim 7, wherein the impedance of the probe is stepped down to a first minimal level of magnitude during a first period of the recovery period immediately following said transmitting period and then to a second minimal level of magnitude lower than said first minimal level during a subsequent period of the recovery period, prior to said receiving period, and said switching control elements are coupled with an inductive element during the period that the impedance of the probe is stepped down to said first minimal level to protect said switching control elements from voltage applied thereto pursuant to the resultant change in impedance, and are decoupled from said inductive element during the period that the impedance of the probe is stepped down to said second minimal level to minimise the inductance of said switching control elements and thus the reactance of the variable impedance to minimise the impedance of the probe to change the Q-factor to said minimal level during the recovery period.

9. An apparatus as claimed in claim 7, wherein the probe is balanced with the switching control elements.

10. An apparatus as claimed in claim 7, wherein said the impedance of the probe is stepped down to a first minimal level of magnitude during a first period of the recovery period immediately following said transmitting period and then to a second minimal level of magnitude lower than said first minimal level during a subsequent period of the recovery period, prior to said receiving period.

11. An apparatus as claimed in claim 10, wherein a said switching control element comprises a triac or thyristor.

12. An apparatus as claimed in claim 7, wherein said switching control elements have a low capacitive reactance.

13. An apparatus as claimed in claim 1, wherein said Q-factor changing circuit comprises a variable impedance unit that combines with the probe to form a tank resonant circuit that is capable of receiving powerful RF pulses applied to the probe to excite an RF magnetic field in the probe during transmitting periods, the value of the total Q-factor of the probe being determined by the impedance of the tank resonant circuit, whereby varying the impedance of the variable impedance unit changes the impedance of the tank resonant circuit, and other elements comprising a capacitor network or zener diodes are included in the tank resonant circuit to improve the voltage sharing during switching.

14. An apparatus as claimed in claim 1, wherein said minimal level of the Q-factor is in orders of magnitude of ones or tenths.

15. An apparatus as claimed in claim 1, wherein said maximal level of the Q-factor is in orders of magnitude of hundreds or thousand.

16. An apparatus as claimed in claim 1, wherein said optimal level of the Q-factor is in orders of magnitude of hundreds.

17. An apparatus as claimed in claim 7, wherein said variable step impedance element is inductive.

18. An apparatus as claimed in claim 17, wherein the switching control elements are included only in the control circuits of the variable step impedance element.

19. An apparatus as claimed in claim 18, wherein said Q-factor changing circuit comprises a variable impedance unit including said variable step impedance element that combines with the probe to form a tank resonant circuit that is capable of receiving powerful RF pulses applied to the probe to excite an RF magnetic field in the probe during transmitting periods, the value of the total Q-factor of the probe being determined by the impedance of the tank resonant circuit, whereby varying the impedance of the variable impedance unit changes the impedance of the tank resonant circuit, and the switching control elements are placed in electrical series with one another and in parallel with resistive elements to enable higher permissible voltages on the tank circuit and to achieve a plurality of possible Q-factor values during the transmitting, recovery and receiving periods.

20. An apparatus as claimed in claim 19, including isolation circuit to electrically isolate low level drive signals for controlling the variable impedance unit.

21. An apparatus as claimed in claim 20, wherein said isolation circuit includes optical isolation and pulse transformers.

22. A method for detecting an NQR or NMR signal within a sample comprising:
  setting the Q-factor of a probe for irradiating a sample with an RF magnetic field pulse to an optimal level to achieve an optimum shape and duration of the RF pulse for subsequent detection of NQR or NMR signals from the sample;
  transmitting the RF magnetic field pulse with the probe set at said optimal level during a prescribed transmitting period to irradiate the sample and excite an NQR or NMR signal in the sample if a substance providing for NQR or NMR is present;
  actively changing the Q-factor of the probe to a minimal level during a prescribed recovery period immediately following the prescribed transmitting period by stepping the impedance of the probe down in a plurality of stages to provide the requisite minimal level of the Q-factor for the probe; and
  actively changing the Q-factor of the probe to a maximal level having high orders of magnitude during a prescribed receiving period immediately following the prescribed recovery period, the maximal level being sufficiently high for detecting the presence of any NQR or NMR signals in a signal received from the substance during the receiving period;
  wherein the optimal level at which the Q-factor for the probe is set during the prescribed transmitting period is:
    (i) sufficiently low to reduce said prescribed recovery period to a period in which said transient signals may be dampened and to develop the leading edge of the pulse envelope of said RF pulse during said transmitting period; and
    (ii) is also sufficiently high to reduce the bandwidth of said RF pulse during said transmitting period and so mitigate the power expended in amplifying the pulse envelope over the bandwidth;
  and wherein said setting and changing of the Q-factor of the probe is performed without injecting a parasitic charge into the probe.

23. A method as claimed in claim 22, including setting or changing the minimal level of the Q-factor of the probe during the recovery period to orders of magnitude of ones or tenths so as to be considerably lower than the Q-factor of the probe before and after the recovery period so as to completely dampen the transient signals and provide for a rapid ring-down in the probe.

24. A method as claimed in claim 22, including setting or changing the maximal level of the Q-factor of the probe during the receiving period to orders of magnitude of hundreds or thousand to be considerably higher than the optimal level of the Q-factor of the probe during the transmitting period and the minimal level of the Q-factor of the probe during the recovery period.

25. A method as claimed in claim 22, wherein the stepping down of the impedance of the probe comprises reducing the Q-factor to a first minimal level of magnitude during a first period of the recovery period immediately following said transmitting period and then to a second minimal level of magnitude lower than said first minimal level during a subsequent period of the recovery period, prior to said receiving period.

26. A method as claimed in claim 25, wherein said first minimal level of the Q-factor is in orders of magnitude of ones, and said second minimal level of the Q-factor is in orders of magnitude of tenths.

27. A method as claimed in claim 22, including setting or changing the optimal level of the Q-factor of the probe during the transmitting period to orders of magnitude of hundreds to be considerably lower than the maximal level of the Q-factor of the probe during the receiving period and considerably higher than the minimal level of the Q-factor of the probe during the recovery period.

28. An apparatus for changing the Q-factor of a probe, having an impedance that can be varied to achieve a Q-factor of minimal orders of magnitude and a Q-factor of high orders of magnitude, for irradiating a sample with RF energy during transmitting periods and detecting an NQR or NMR signal emitted from a substance contained within the sample from a signal received by the probe during receiving periods, the apparatus comprising:
  means for setting the Q-factor of a probe from minimal orders of magnitude to high orders of magnitude;
  means for actively changing the Q-factor of the probe having low reactance to prevent injecting a parasitic charge therein; and
  means for controlling the Q-factor changing means so as to change the Q-factor of the probe, in accordance with the Q-factor setting means, to:
    (i) an optimal level during a prescribed transmitting period of an RF pulse for irradiating the sample with said RF energy;
    (ii) a minimal level during a prescribed recovery period immediately following said transmitting period to rapidly dampen transient signals from the probe; and
    (iii) a maximal level during a prescribed receiving period for detecting an NQR or NMR signal from the target substance if present, immediately following the recovery period;
  said optimal level being:
    (a) sufficiently low to reduce said prescribed recovery period to a period in which said transient signals may be dampened and to develop the leading edge of the pulse envelope of said RF pulse during said transmitting period; and
    (b) sufficiently high to reduce the bandwidth of said RF pulse during said transmitting period and so mitigate the power expended in amplifying the pulse envelope over the bandwidth; and
  said maximal level being sufficiently high for the probe to receive a signal during the receiving period, after the recovery period, to enable an NQR or NMR signal emitted from a substance within the sample to be detected;
  wherein the control means is adapted to control said Q-factor changing means in accordance with said Q-factor setting means to actively step the impedance of the probe down in a plurality of stages after said transmitting period for some period of time during the recovery period to provide the requisite minimal level of the Q-factor for the probe.

* * * * *

UNITED STATES PATENT AND TRADEMARK OFFICE
CERTIFICATE OF CORRECTION

| | | |
|---|---|---|
| PATENT NO. | : 7,109,714 B2 | Page 1 of 1 |
| APPLICATION NO. | : 10/838256 | |
| DATED | : September 19, 2006 | |
| INVENTOR(S) | : Rudakov et al. | |

It is certified that error appears in the above-identified patent and that said Letters Patent is hereby corrected as shown below:

Title Page should read
--(73)   Assignee: QRSciences Pty. Ltd., (AU)--

Signed and Sealed this

Twenty-seventh Day of March, 2007

JON W. DUDAS
*Director of the United States Patent and Trademark Office*